(12) United States Patent
Um et al.

(10) Patent No.: US 10,826,003 B2
(45) Date of Patent: Nov. 3, 2020

(54) DISPLAY APPARATUS AND METHOD OF MANUFACTURING THE SAME

(71) Applicant: Samsung Display Co., Ltd., Yongin-Si (KR)

(72) Inventors: Dongbin Um, Yongin-si (KR); Joonsam Kim, Yongin-si (KR); Jinsic Min, Yongin-si (KR); Euncheol Son, Yongin-si (KR); Kyeongyeol Heo, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/251,751

(22) Filed: Jan. 18, 2019

(65) Prior Publication Data

US 2019/0157590 A1 May 23, 2019

Related U.S. Application Data

(62) Division of application No. 15/719,183, filed on Sep. 28, 2017, now Pat. No. 10,224,498.

(30) Foreign Application Priority Data

Sep. 29, 2016 (KR) .......................... 10-2016-0125591

(51) Int. Cl.
*H01L 51/00* (2006.01)
*H01L 51/52* (2006.01)
(Continued)

(52) U.S. Cl.
CPC ...... *H01L 51/0097* (2013.01); *H01L 51/5253* (2013.01); *H01L 51/56* (2013.01);
(Continued)

(58) Field of Classification Search
CPC . H01L 51/0097; H01L 51/56; H01L 51/5253; H01L 2251/566; H01L 2251/5338
See application file for complete search history.

(56) References Cited

U.S. PATENT DOCUMENTS 4,684,041 A 8/1987 Jones et al.
2011/0315956 A1* 12/2011 Tischler .............. H01L 23/4985
257/13

(Continued)

FOREIGN PATENT DOCUMENTS

KR 10-2010-0082439 A 7/2010
KR 10-2011-0124534 A 11/2011
(Continued)

OTHER PUBLICATIONS

European Search Report corresponding to EP Application No. 17192003.6, dated Feb. 15, 2018, 10 pages.

*Primary Examiner* — Julia Slutsker
(74) *Attorney, Agent, or Firm* — Innovation Counsel LLP

(57) ABSTRACT

Provided are a display apparatus and a method of manufacturing the display apparatus. The display apparatus includes: a substrate including a bending area located between a first area and a second area and bent in the bending area; a display unit arranged over an upper surface of the substrate and located in the first area; a protection film located over a lower surface of the substrate and including a protection film base and a viscous layer; and a bending protection layer including a first bending protection layer and a second bending protection layer and corresponding to the bending area, wherein the protection film is located over the lower surface of the substrate and has an opening corresponding to the bending area or at least a part of the first area, and wherein the first bending protection layer is arranged over at least a part of a boundary of the opening or over an outside of the boundary of the opening, and at least a part of the second bending protection layer is arranged over an inside of the boundary of the opening.

15 Claims, 19 Drawing Sheets

(51) Int. Cl.
*H01L 51/56* (2006.01)
*H01L 27/32* (2006.01)

(52) U.S. Cl.
CPC ........ *H01L 27/323* (2013.01); *H01L 27/3244* (2013.01); *H01L 27/3276* (2013.01); *H01L 51/5281* (2013.01); *H01L 2227/323* (2013.01); *H01L 2251/5338* (2013.01); *H01L 2251/566* (2013.01); *Y02E 10/549* (2013.01)

(56) References Cited

U.S. PATENT DOCUMENTS

| | | | |
|---|---|---|---|
| 2013/0169515 A1* | 7/2013 | Prushinskiy | G06F 1/1652 345/55 |
| 2014/0217382 A1* | 8/2014 | Kwon | H01L 51/0097 257/40 |
| 2015/0102296 A1 | 4/2015 | Kim et al. | |
| 2015/0115248 A1 | 4/2015 | Chun et al. | |
| 2015/0380679 A1 | 12/2015 | Fujiyoshi et al. | |
| 2016/0044751 A1* | 2/2016 | Ikeda | H05B 33/02 362/227 |
| 2016/0174304 A1* | 6/2016 | Kim | H05B 33/04 313/511 |
| 2016/0181554 A1* | 6/2016 | Liu | H01L 51/56 257/40 |

FOREIGN PATENT DOCUMENTS

| | | |
|---|---|---|
| KR | 10-1330759 B1 | 11/2013 |
| KR | 10-1416768 B1 | 7/2014 |
| WO | 2016-093476 A1 | 6/2016 |

\* cited by examiner

DISPLAY APPARATUS AND METHOD OF MANUFACTURING THE SAME

CROSS-REFERENCE TO RELATED APPLICATION

This application is a divisional application of U.S. patent application Ser. No. 15/719,183 filed on Sep. 28, 2017, which claims priority to and the benefit of Korean Patent Application No. 10-2016-0125591, filed on Sep. 29, 2016, in the Korean Intellectual Property Office, the disclosure of which is incorporated herein in its entirety by reference.

BACKGROUND

1. Field

One or more example embodiments relate to an apparatus and a method, and more particularly, to a display apparatus and a method of manufacturing the display apparatus.

2. Description of the Related Art

In general, a display apparatus has a display located over a substrate. At least a part of the display apparatus is bent, thereby enhancing visibility at various angles or reducing an area of a non-display area.

However, the process of manufacturing such a bent display apparatus may cause a defect to occur, a lifetime of the display apparatus to be reduced, or a manufacturing cost to be excessive.

SUMMARY

One or more example embodiments include a display apparatus that can be manufactured via a manufacturing process with low costs and a reduced defect rate and a method of manufacturing the display apparatus, so as to solve problems including the problems described above. However, the embodiments are not limited to solving the above problems only.

Additional aspects will be set forth in part in the description which follows and, in part, will be apparent from the description, or may be learned by practice of the presented embodiments.

According to one or more embodiments, a display apparatus includes: a substrate including a bending area located between a first area and a second area and bent in the bending area; a display unit arranged over an upper surface of the substrate and located in the first area; a protection film located over a lower surface of the substrate and including a protection film base and a viscous layer; and a bending protection layer including a first bending protection layer and a second bending protection layer and corresponding to the bending area, wherein the protection film has an opening corresponding to the bending area or at least a part of the first area, and wherein the first bending protection layer is arranged over at least a part of a boundary of the opening or over an outside of the boundary of the opening, and at least a part of the second bending protection layer is arranged over an inside of the boundary of the opening.

The maximum height of the first bending protection layer may be greater than a maximum height of the second bending protection layer.

The first bending protection layer may at least partially overlap the second bending protection layer.

A point corresponding to a maximum height of the first bending protection layer may be outside the boundary of the opening.

The first bending protection layer may be arranged over the substrate and overlaps the boundary of the opening.

The first bending protection layer may be formed in a closed loop.

An area of the bending protection layer may be greater than an area of the opening.

An area of the opening may be greater than an area of the bending area.

The display apparatus may further include: a filler configured to at least partially fill the inside of the opening.

The substrate may be bent so that a part of a lower surface of the first area and at least a part of a lower surface of the second area face each other, and the protection film base corresponds to the first area and the second area and includes the opening corresponding to the bending area, and the display apparatus further includes: a cushion layer in contact with both a part of the protection film base over the first area and a part of the protection film base over the second area.

The display apparatus may further include: an inorganic insulating layer arranged over the substrate; a first conductive layer extending from the first area to the second area via the bending area and arranged over the inorganic insulating layer; and an organic material layer arranged between the inorganic insulating layer and the first conductive layer and overlapping the bending area.

The inorganic insulating layer may have a flat upper surface in an area in which the inorganic insulating layer overlaps the organic material layer.

The inorganic insulating layer may have a groove or an opening in an area in which the inorganic insulating layer overlaps the organic material layer so that the organic material layer fills the groove or the opening.

At least a part of an upper surface of the organic material layer may have an uneven surface.

According to one or more embodiments, a method of manufacturing a display apparatus includes: forming a display unit in a first area of a substrate including a bending area located between the first area and a second area; attaching a protection film onto a lower surface of the substrate, wherein the protection film includes a protection film base and a viscous layer; forming a first bending protection layer over the substrate corresponding to at least a part of a boundary of the opening or over the substrate of an outside of the boundary of the opening and curing the first bending protection layer; and forming a second bending protection layer over the substrate so that at least a part of the second bending protection layer corresponds to an inside of the boundary of the opening.

The method may further include: attaching a carrier film onto the protection film.

The method may further include: curing the second bending protection layer.

At least a part of the second bending protection layer may overlap the first bending protection layer.

A maximum height of the first bending protection layer may be greater than a maximum height of the second bending protection layer.

A point corresponding to a maximum height of the first bending protection layer may be outside the boundary of the opening.

The first bending protection layer may be arranged over the substrate and overlaps the boundary of the opening.

The first bending protection layer may be formed in a closed loop.

An area of the bending protection layer may be greater than an area of the opening.

An area of the opening may be greater than an area of the bending area.

The method may further include: bending the substrate with respect to a bending axis in the bending area.

The method may further include: at least partially filling the opening with a filler after bending the substrate.

The method may further include: arranging a cushion layer between the first area and the second area after the bending of the substrate.

The method may further include: coating the opening with a liquefied or paste filler.

The method may further include: curing the liquefied or paste filler.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
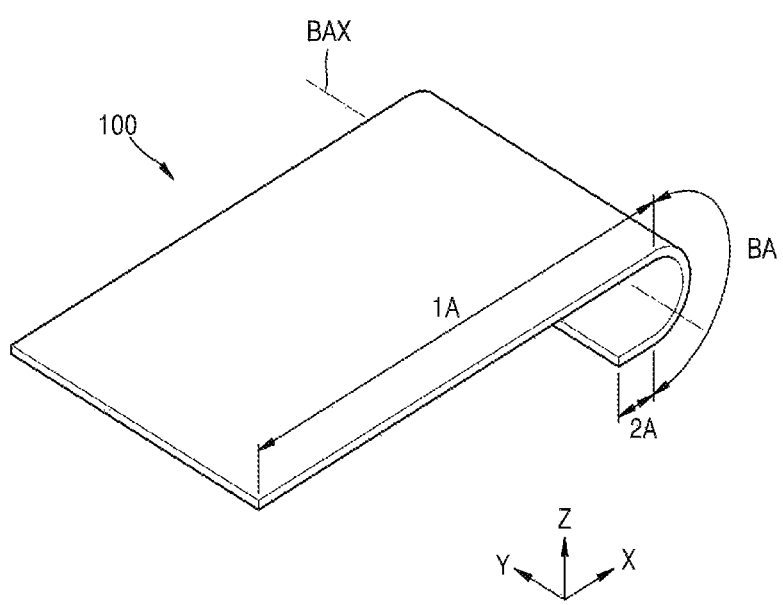
FIG. 1 is a perspective view of a part of a display apparatus according to an example embodiment.

As the disclosure allows for various changes and numerous embodiments, embodiments will be illustrated in the drawings and described in detail in the written description. Advantages and features of one or more embodiments and methods of accomplishing the same may be understood more readily by reference to the following detailed description of the one or more embodiments and the accompanying drawings. The disclosure may, however, be embodied in many different forms and should not be construed as being limited to the one or more embodiments set forth herein.

Reference will now be made in detail to embodiments, examples of which are illustrated in the accompanying drawings. Like reference numerals in the drawings denote like elements, and a repeated description thereof will be omitted.

While such terms as "first" and "second" may be used to describe various components, such components must not be limited to the above terms. The above terms are used only to distinguish one component from another.

The singular forms "a," "an," and "the" used herein are intended to include the plural forms as well, unless the context clearly indicates otherwise.

It will be understood that the terms such as "include," "comprise," and "have" used herein specify the presence of stated features or components, but do not preclude the presence or addition of one or more other features or components.

It will be further understood that when a layer, region, or component is referred to as being "on" another layer, region, or component, it can be directly or indirectly on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, embodiments are not limited thereto.

The x-axis, the y-axis, and the z-axis are not limited to the three axes of the rectangular coordinate system and may be interpreted in a broader sense. For example, the x-axis, the y-axis, and the z-axis may be perpendicular to one another or may represent different directions that are not perpendicular to one another.

When an example embodiment may be implemented differently, a specific process order may be performed differently from the described order. For example, two consecutively described processes may be performed substantially at the same time or performed in an order opposite to the described order. As used herein, the term "and/or" includes any and all combinations of one or more of the associated listed items.

FIG. 1 is a perspective view of a part of a display apparatus according to an example embodiment.

Referring to FIG. 1, the display apparatus may include a display panel (not shown), a protection film (not shown), and a flexible circuit (not shown). The display apparatus is partially bent and thus has a partially bent shape.

A substrate 100 included in the display panel may have a bending area BA extending in a first direction (+y direction). The bending area BA may be located between a first area 1A and a second area 2A in a second direction (+x direction) across the first direction. The substrate 100 may be bent with respect to a bending axis BAX extending in the first direction (+y direction) as shown in FIG. 1. The substrate 100 may include various materials having a flexible or bendable characteristic, for example, polymer resin such as polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide (PI), polycarbonate (PC) or cellulose acetate propionate (CAP). The substrate 100 may have a single layer structure or a multilayer structure. In some example embodiments, the substrate 100 may have a structure in which a resin layer including resin and a barrier layer including an inorganic material such as silicon oxide or a silicon nitride are alternately stacked, a structure further including an intermediate layer including amorphous silicon between the resin layer and the barrier layer. The substrate 100 may be modified in various ways.

A manufacturing sequence of the display apparatus, the protection film, and the flexible circuit will now be described in detail below.

Figure 2:
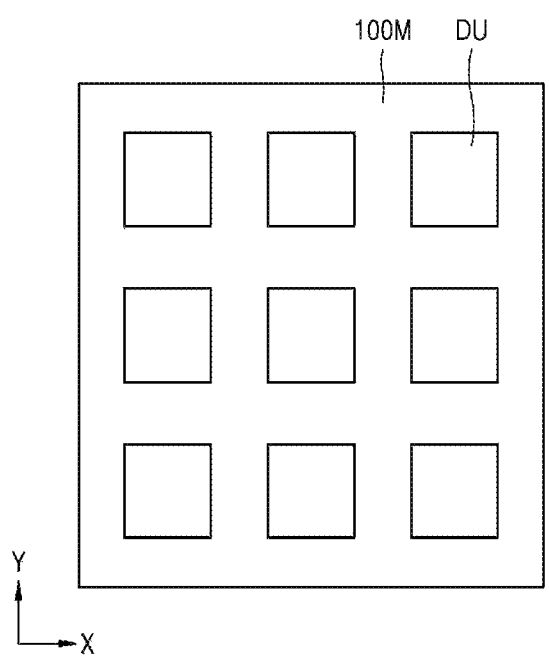
FIG. 2 is a plan view for describing a manufacturing sequence of the display apparatus of FIG. 1 according to an example embodiment.
Figure 3:
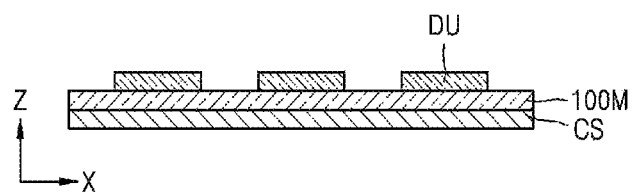
FIG. 3 is a cross-sectional view for describing a manufacturing sequence of the display apparatus of FIG. 1 according to an example embodiment.
Figure 4:
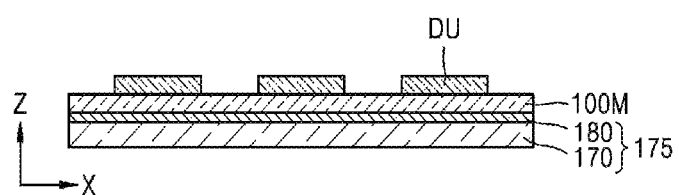
FIG. 4 is a cross-sectional view for describing a manufacturing sequence of the display apparatus of FIG. 1 according to an example embodiment.
Figure 5:
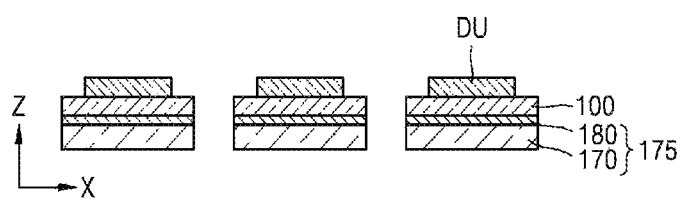
FIG. 5 is a cross-sectional view for describing a manufacturing sequence of the display apparatus of FIG. 1 according to an example embodiment.

FIG. 2 is a plan view for describing a manufacturing sequence of the display apparatus of FIG. 1 according to an example embodiment. FIG. 3 is a cross-sectional view for describing a manufacturing sequence of the display apparatus of FIG. 1 according to an example embodiment. FIG. 4 is a cross-sectional view for describing a manufacturing sequence of the display apparatus of FIG. 1 according to an example embodiment. FIG. 5 is a cross-sectional view for describing a manufacturing sequence of the display apparatus of FIG. 1 according to an example embodiment.

Referring to FIGS. 2 through 5, a single display unit DU may be formed in a mother substrate 100M and a plurality of display units DU may be formed in the mother substrate 100M. For convenience of description, as shown in FIG. 2, a case wherein the plurality of display units DU are formed in the mother substrate 100M will be described in detail below.

Various methods of forming the plurality of display units DU in the mother substrate 100M may be used.

In an example embodiment, the plurality of display units DU may be formed over an upper surface of the mother substrate 100M. Other processes may be performed before forming the plurality of display units DU. For example, a process of forming a buffer layer in an entire surface of the mother substrate 100M may be performed. In addition, when the plurality of display units DU is formed, electronic devices such as a thin film transistor (TFT) electrically connected to display devices may also be formed, besides the display devices. Electronic devices may be formed in a periphery area outside a display area in which the display devices are located. When the plurality of display units DU is formed, an encapsulation layer may also be formed in order to protect the display devices. A detailed configuration of the display unit DU will be described below.

In another example embodiment, as shown in FIG. 3, the plurality of display units DU may be formed in the mother substrate 100M after forming the mother substrate 100M over a support substrate CS. The support substrate CS may include, for example, glass of a sufficient thickness. The support substrate CS may have a sufficient hardness to prevent the mother substrate 100M having a flexible or bendable characteristic from being distorted or modified during a manufacturing process. For example, the mother substrate 100M may be formed over the support substrate CS having the sufficient hardness, and then the plurality of display units DU may be formed in the mother substrate 100M.

For convenience of description, a case wherein the plurality of display units DU is formed in the mother substrate 100M after forming the mother substrate 100M over the support substrate CS will be described in detail below.

After forming the display units DU as described above, the mother substrate 100M may be separated from the support substrate CS. As shown in FIG. 4, a protection film 175 may be attached onto a lower surface of the mother substrate 100M from which the support substrate CS is separated (−z direction).

After attaching the protection film 175 onto the lower surface of the mother substrate 100M, the mother substrate 100M and the protection film 175 may be simultaneously cut. Specifically, the mother substrate 100M and the protection film 175 may be cut around each of the plurality of display units DU in order to separate the mother substrate 100M into the plurality of substrates 100, as shown in FIG. 5. Accordingly, a plurality of display panels may be obtained. The mother substrate 100M and the protection film 175 may be cut by using various methods. For example, the mother substrate 100M and the protection film 175 may be cut by irradiation with a laser beam or by placing a cutting wheel in contact with the mother substrate 100M and/or the protection film 175.

The protection film 175 may include a protection film base 170 and a viscous layer 180. In this regard, the protection film base 170 may include polyethylene terephthalate (PET) or polyimide (PI). The viscous layer 180 may include various viscous materials. For convenience of description, a case wherein the protection film base 170 includes PET will now be described in detail below.

Figure 6:
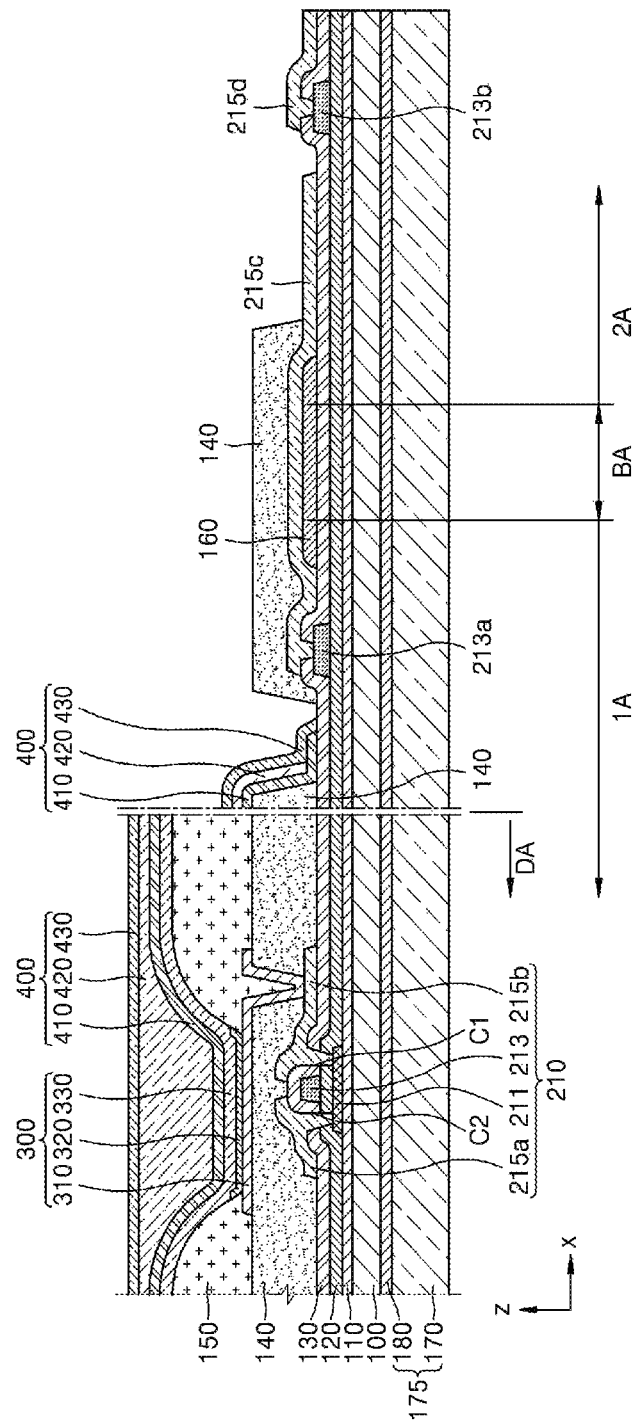
FIG. 6 is a cross-sectional view of a display panel manufactured according to the manufacturing sequence of the display apparatus of FIG. 5 according to an example embodiment.

FIG. 6 is a cross-sectional view of a display panel manufactured according to the manufacturing sequence of the display apparatus of FIG. 5 according to an example embodiment.

Referring to FIG. 6, the display panel (not shown) may be manufactured through the above-described processes. In this regard, the first area 1A of the substrate 100 may include a display area DA. The first area 1A may include a part of a non-display area outside the display area DA, in addition to the display area DA, as shown in FIG. 6. The second area 2A may also include a non-display area. A display device such as an organic light-emitting device 300 or a display unit including a TFT 210 may be arranged in the first area 1A. The display unit DU may include only components arranged in the display area DA or may include components that belong to the first area 1A and are arranged in the non-display area. The substrate 100 may include the bending area BA between the first area 1A and the second area 2A. The substrate 100 will be bent in the bending area BA later, to have the shape shown in FIG. 1.

A plurality of pixels may be arranged in the display area DA of the display panel to form an image. Devices such as a display device such as the organic light-emitting device 300, the TFT 210, a capacitor Cst, etc. may be provided in the display area DA. Signal wirings such as a gate line transferring a gate signal, a data line transferring a data signal, a driving power line transferring power, a common power line, etc. may be further included in the display area DA. A pixel may be formed by an electrical coupling of the TFT 210, the capacitor Cst, the display device such as the organic light-emitting device 300, etc. that are connected to the gate line, the data line, and the driving power line, thereby displaying an image. The pixel may emit light with brightness corresponding to a driving current through the organic light-emitting device 300 in correspondence to the data signal according to driving power and common power that are supplied to the pixel. A plurality of pixels may be configured and may be arranged in various shapes such as a stripe layout, a pentile layout, etc.

An electrical connection of the organic light-emitting device 300 to the TFT 210 may be understood as an electrical connection of a pixel electrode 310 to the TFT 210. If necessary, a TFT (not shown) may be arranged in a periphery area outside the display area DA of the substrate 100. The TFT arranged in the periphery area may be, for example, a part of a circuit for controlling an electrical signal applied to the display area DA.

The TFT 210 may include a semiconductor layer 211 including amorphous silicon, polycrystalline silicon, oxide semiconductor, or an organic semiconductor material, a gate electrode 213, a source electrode 215a, and a drain electrode 215b.

The gate electrode 213 may be connected to a gate wiring (not shown) applying an on/off signal to the TFT 210 and may include a low resistance metal material. For example, the gate electrode 213 may include a conductive material including molybdenum (Mo), aluminum (Al), copper (Cu), and/or titanium (Ti) in a single layer structure or a multilayer structure.

The source electrode 215a and the drain electrode 215b may include a conductive material having a high conductivity in a single layer structure or a multilayer structure and may be respectively connected to a source area and a drain area of the semiconductor layer 211. For example, the source electrode 215a and the drain electrode 215b may include a conductive material including aluminum (Al), copper (Cu), and/or titanium (Ti), etc. in a single layer structure or a multilayer structure.

The source electrode 215a and the drain electrode 215b may be connected to the semiconductor layer 211 through contact holes C2 and C1. The contact holes C1 and C2 may be formed by simultaneously etching an interlayer insulating layer 130 and a gate insulating layer 120.

The TFT 210 according to an example embodiment may be a top gate type in which the gate electrode 213 is arranged over the semiconductor layer 211 but the disclosure is not limited thereto. The TFT 210 according to another embodiment may be a bottom gate type in which the gate electrode 213 is arranged below the semiconductor layer 211.

For insulation between the semiconductor layer 211 and the gate electrode 213, the gate insulating layer 120 including an inorganic material such as silicon oxide, silicon nitride and/or silicon oxynitride may be interposed between the semiconductor layer 211 and the gate electrode 213. In addition, the interlayer insulating layer 130 may be arranged over the gate electrode 213 and may include an inorganic material such as silicon oxide, silicon nitride and/or silicon oxynitride. The source electrode 215a and the drain electrode 215b may be arranged over the interlayer insulating layer 130. An insulating layer including an inorganic material may be formed through chemical vapor deposition (CVD) or atomic layer deposition (ALD). This is applied to embodiments that will be described below and modifications thereof.

A buffer layer 110 may be interposed between the TFT 210 having the structure over and the substrate 100 and may include an inorganic material such as silicon oxide, silicon nitride and/or silicon oxynitride. The buffer layer 110 may have a single layer structure or a multilayer structure. The buffer layer 110 may increase flatness of an upper surface of the substrate 100 or prevent or minimize impurities from infiltrating into the semiconductor layer 211 of the TFT 210 from the substrate 100.

A planarization layer 140 may be arranged over the TFT 210. For example, as shown in FIG. 6, when the organic light-emitting device 300 is arranged over the TFT 210, the planarization layer 140 may generally planarize an upper surface of a protective layer covering the TFT 210. The planarization layer 140 may include, for example, an organic material such as acryl, benzocyclobutene (BCB), or hexamethyldisiloxane (HMDSO), etc. Although the planarization layer 140 has a single layer structure in FIG. 6, the planarization layer 140 may be modified in various ways such as a multilayer structure. As shown in FIG. 6, the planarization layer 140 may have an opening outside the display area DA to physically separate a part of the planarization layer 140 of the display area DA and a part of the planarization layer 140 of the second area 2A. This may be used to prevent external impurities from infiltrating into the display area DA through the planarization layer 140. The planarization layer 140 of the second area 2A may not be provided.

In the display area DA of the substrate 100, the organic light-emitting device 300 including the pixel electrode 310, an opposite electrode 330, and an intermediate layer 320 interposed between the pixel electrode 310 and the opposite electrode 330 and including an emission layer (EML) may be located over the planarization layer 140. The pixel electrode 310 may be in contact with one of the source electrode 215a and the drain electrode 215b through an opening formed in the planarization layer 140, etc. and may be electrically connected to the TFT 210.

A pixel-defining layer 150 may be arranged over the planarization layer 140. The pixel-defining layer 150 may have an opening corresponding to each of sub pixels, i.e. an opening exposing a center of at least the pixel electrode 310 to define a pixel. The pixel-defining layer 150 may increase a distance between an edge of the pixel electrode 310 and the opposite electrode 330 over the pixel electrode 310 to prevent an arc, etc. from being generated in the edge of the pixel electrode 310. The pixel-defining layer 150 may include an organic material such as polyimide or hexamethyldisiloxane (HMDSO), etc.

The intermediate layer 320 of the organic light-emitting device 300 may include a low molecular material or a high molecular material. When the intermediate layer 320 includes the low molecular material, the intermediate layer 320 may include a hole injection layer (HIL), a hole transport layer (HTL), the EML, an electron transport layer (ETL), an electron injection layer (EIL), and the like that are stacked in a single or complex structure and may include various organic materials such as copper phthalocyanine (CuPc), N,N'-Di(naphthalene-1-yl)-N,N'-diphenyl-benzidine (NPB), tris-8-hydroxyquinoline aluminum) (Alq3), etc. These layers may be formed by using a vacuum deposition method.

When the intermediate layer 320 includes the high molecular material, the intermediate layer 320 may generally have a structure including the HTL and the EML. In this regard, the HTL may include a high molecular material such as poly-phenylenevinylene (PPV) and polyfluorene. The intermediate layer 320 may be formed through screen printing, inkjet printing, laser induced thermal imaging (LITI), etc.

However, the intermediate layer 320 is not necessarily limited thereto and may have various structures. The intermediate layer 320 may include a layer integral with a plurality of pixel electrodes 310 and may include a patterned layer to correspond to each of the plurality of pixel electrodes 310.

The opposite electrode 330 may be arranged in an upper portion of the display area DA and, as shown in FIG. 6, to cover the display area DA. That is, the opposite electrode 330 may be integrally formed with a plurality of organic light-emitting devices to correspond to the plurality of pixel electrodes 310.

The plurality of organic light-emitting devices 300 may be easily damaged by external moisture or oxygen, and thus an encapsulation layer 400 may cover the plurality of organic light-emitting devices 300 to protect the plurality of organic light-emitting devices 300. The encapsulation layer 400 may cover the display area DA and extend outside the display area DA. The encapsulation layer 400 may include a first inorganic encapsulation layer 410, an organic encapsulation layer 420, and a second inorganic encapsulation layer 430.

The first inorganic encapsulation layer 410 may cover the opposite electrode 330 and may include silicon oxide, silicon nitride and/or silicon oxynitride. If necessary, other layers such as a capping layer may be interposed between the first inorganic encapsulation layer 410 and the opposite electrode 330. The first inorganic encapsulation layer 410 may be formed according to a structure of a lower portion thereof, and thus, as shown in FIG. 6, an upper surface thereof may not be flat. The organic encapsulation layer 420 may cover the first inorganic encapsulation layer 410 and may have an approximately flat upper surface, unlike the first inorganic encapsulation layer 410. Specifically, an upper surface of the organic encapsulation layer 420 may be approximately flat in a part corresponding to the display area DA. The organic encapsulation layer 420 may include one or more materials selected from the group consisting of polyethylene terephthalate, polyethylene naphthalate, polycarbonate, polyimide, polyethylene sulfonate, polyoxymethylene, polyarylate, and hexamethyldisiloxane. The second inorganic encapsulation layer 430 may cover the organic encapsulation layer 420 and may include silicon oxide, silicon nitride and/or silicon oxynitride. The second inorganic encapsulation layer 430 may be in contact with the first inorganic encapsulation layer 410 in an edge thereof outside the display area DA, and thus the organic encapsulation layer 420 may not be exposed to the outside.

Since the encapsulation layer 400 may include the first inorganic encapsulation layer 410, the organic encapsulation layer 420, and the second inorganic encapsulation layer 430, although cracks occur in the encapsulation layer 400 through such a multilayer structure, such cracks may not be connected between the first inorganic encapsulation layer 410 and the organic encapsulation layer 420 or between the organic encapsulation layer 420 and the second inorganic encapsulation layer 430, thereby preventing or minimizing a path through which external moisture or oxygen infiltrates into the display area DA from being formed.

The buffer layer 110, the gate insulating layer 120, and the interlayer insulating layer 130 that include inorganic materials may be called an inorganic insulating layer. In FIG. 6, the inorganic insulating layer may have a flat upper surface in an area overlapping an organic material layer 160 that will be described below.

The display panel may include a first conductive layer 215c arranged over the inorganic insulating layer. The first conductive layer 215c may extend from the first area 1A to the second area 2A via the bending area BA. The first conductive layer 215c may function as a wiring transferring an electrical signal to the display area DA. The first conductive layer 215c may include the same material as the source electrode 215a or the drain electrode 215b and may be simultaneously formed with the source electrode 215a or the drain electrode 215b.

The display panel may include the organic material layer 160 that may be interposed between the inorganic insulating layer and the first conductive layer 215c and may overlap the bending area BA. The organic material layer 160 may buffer or absorb tensile stress applied to the substrate 100 and the inorganic insulating layer, when the substrate 100 and the inorganic insulating layer are bent, to minimize tensile stress applied to the first conductive layer 215c.

If the organic material layer 160 is not interposed between the first conductive layer 215c and the inorganic insulating layer and thus the first conductive layer 215c is arranged over the inorganic insulating layer in the bending area BA, when the substrate 100 is bent, high tensile stress may be applied to the first conductive layer 215c. Since hardness of the inorganic insulating layer is higher than that of the organic material layer 160, there may be a high probability that cracks occur in the inorganic insulating layer in the bending area BA. When cracks occur in the inorganic insulating layer, since cracks occur in the first conductive layer 215c over the inorganic insulating layer, there may be a high probability that defects such as a disconnection of the first conductive layer 215c occur.

However, in the display apparatus according to the present embodiment, the organic material layer 160 may be interposed between the first conductive layer 215c and the inorganic insulating layer in the bending area BA, and thus tensile stress applied to the substrate 100 and the inorganic insulating layer may be buffered or absorbed, thereby minimizing tensile stress applied to the first conductive layer 215c. Thus, cracks may be prevented from occurring in a part of the first conductive layer 215c located over the organic material layer 160 in the bending area BA or an occurrence rate of cracks may be minimized.

The organic material layer 160 may overlap the bending area BA and may extend to a part of a non-bending area. In other words, the organic material layer 160 may be formed over the inorganic insulating layer to have a predetermined width ORW and may overlap the bending area BA. An area of the organic material layer 160 may be greater than that of the bending area BA. To this end, in FIG. 6, the width ORW of the organic material layer 160 is greater than that of the bending area BA. A thickness of the organic material layer 160 overlapping the bending area BA may be greater than that of a non-overlapping area in consideration of a stress applied according to bending. The organic material layer 160 may include polyimide, acryl, BCB, or HMDSO, etc.

The display panel may include second conductive layers 213a and 213b, and a third conductive layer 215d arranged in the same layer as the first conductive layer 215c, in addition to the first conductive layer 215c. The second conductive layers 213a and 213b may be arranged in the first area 1A or the second area 2A in order to locate the second conductive layers 213a and 213b in a different layer from the first conductive layer 215c and may be electrically connected to the first conductive layer 215c or the third conductive layer 215d. In FIG. 6, the second conductive layers 213a and 213b includes the same material as the gate electrode 213 of the TFT 210 in the same layer, i.e. the gate insulating layer 120. In FIG. 6, the first conductive layer 215c is in contact with the second conductive layer 213a located in the first area 1A through a contact hole formed in the interlayer insulating layer 130. In addition, in FIG. 6, the third conductive layer 215d is in contact with the second conductive layer 213b located in the second area 2A.

The second conductive layer 213a located in the first area 1A may be electrically connected to a TFT 210, etc. of the display area DA, so that the first conductive layer 215c may be electrically connected to the TFT 210, etc. of the display area DA through the second conductive layer 213a. The second conductive layer 213b located in the second area 2A may also be electrically connected to the TFT 210, etc. of the display area DA. The second conductive layers 213a and 213b may be located outside the display area DA and may be electrically connected to components located in the display area DA. The second conductive layers 213a and 213b may be located outside the display area DA and may extend in a direction of the display area DA to be at least partially located in the display area DA.

The first conductive layer 215c across the bending area BA may include a material of a high elongation percentage, thereby preventing defects such as cracks occurring in the first conductive layer 215c or a disconnection of the first conductive layer 215c. In addition, the second conductive layers 213a and 213b having a lower elongation percentage than the first conductive layer 215c and including a material having an electrical/physical characteristic different from the first conductive layer 215c may be formed in the first area 1A or the second area 2A, thereby increasing an efficiency of the display apparatus in transferring electrical signals or reducing an occurrence rate of defects during a manufacturing process. For example, the second conductive layers 213a and 213b may include molybdenum, and the first conductive layer 215c may include aluminum. The first conductive layer 215c or the second conductive layers 213a and 213b may have a multilayer structure if necessary.

In some embodiments, the first conductive layer 215c and the third conductive layer 215d may be formed simultaneously with the source electrode 215a and the drain electrode 215b, and the second conductive layers 213a and 213b may be formed simultaneously with the gate electrode 213.

Figure 7:
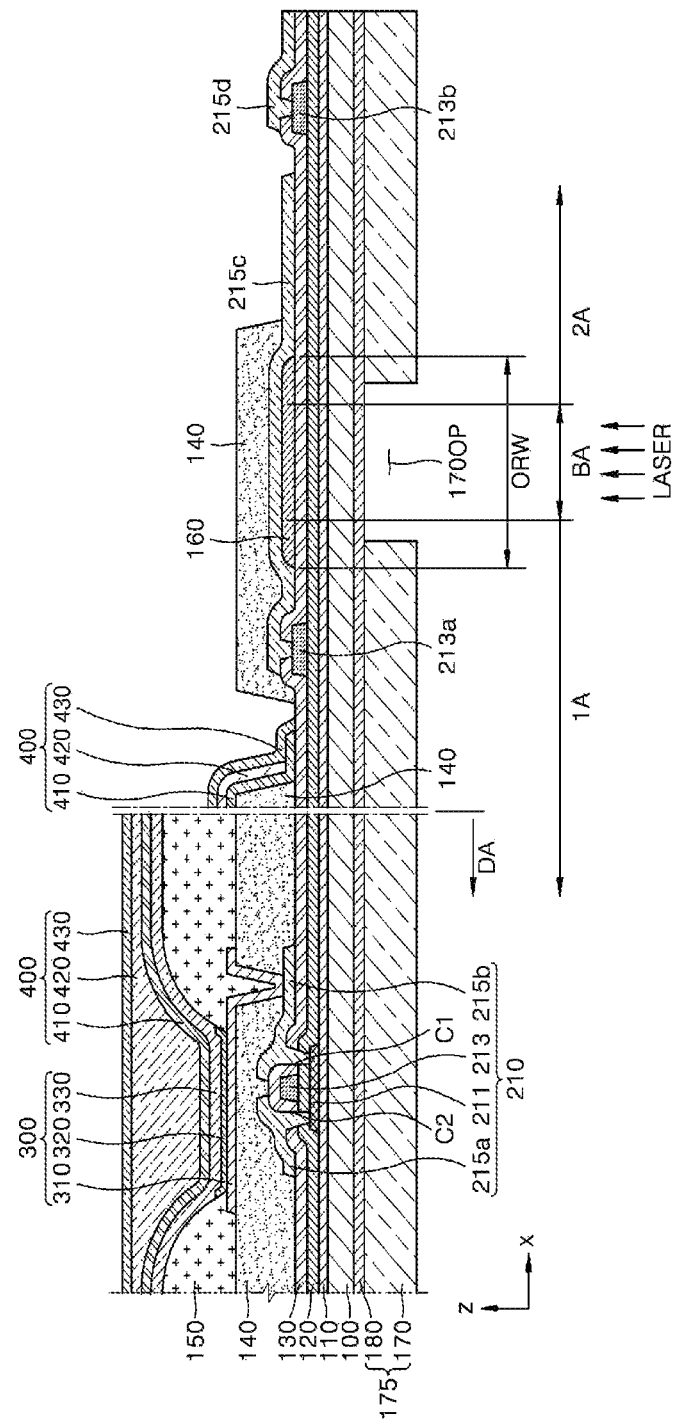
FIG. 7 is a cross-sectional view for describing a manufacturing sequence of the display apparatus of FIG. 1 according to an example embodiment.

FIG. 7 is a cross-sectional view for describing a manufacturing sequence of the display apparatus of FIG. 1.

Referring to FIG. 7, after a display panel is prepared as described above, an opening 170OP may be formed in the protection film 175. In this regard, the opening 170OP may be formed by removing a lower surface of the protection film 175 by using a blade BL and/or laser. In particular, in this case, the protection film base 170 at the opening 170OP or parts of the protection film base 170 and the viscous layer 180 at the opening 170OP may be removed. However, for convenience of description, a case where only the protection film base 170 at the opening 170OP is removed will be described in detail below.

A method of forming the opening 170OP in the protection film 175 is not limited to the above-described method. For example, the opening 170OP may be formed in the protection film 175 by forming a pattern on the protection film 175, attaching a separate film onto the pattern, and removing the attached film. However, for convenience of description, a case where the opening 170OP is formed by using laser will be described in detail below.

In order to minimize stress applied to the protection film base 170, as shown in FIG. 7, the bending area BA may be located in the opening 170OP of the protection film base 170. This may be understood that an area of the opening 170OP of the protection film base 170 is greater than that of the bending area BA. However, the disclosure is not limited thereto. The opening 170OP of the protection film base 170 may be located in the bending area BA. This may be understood that an area of the bending area BA is greater than that of the opening 170OP of the protection film base 170.

Figure 8:
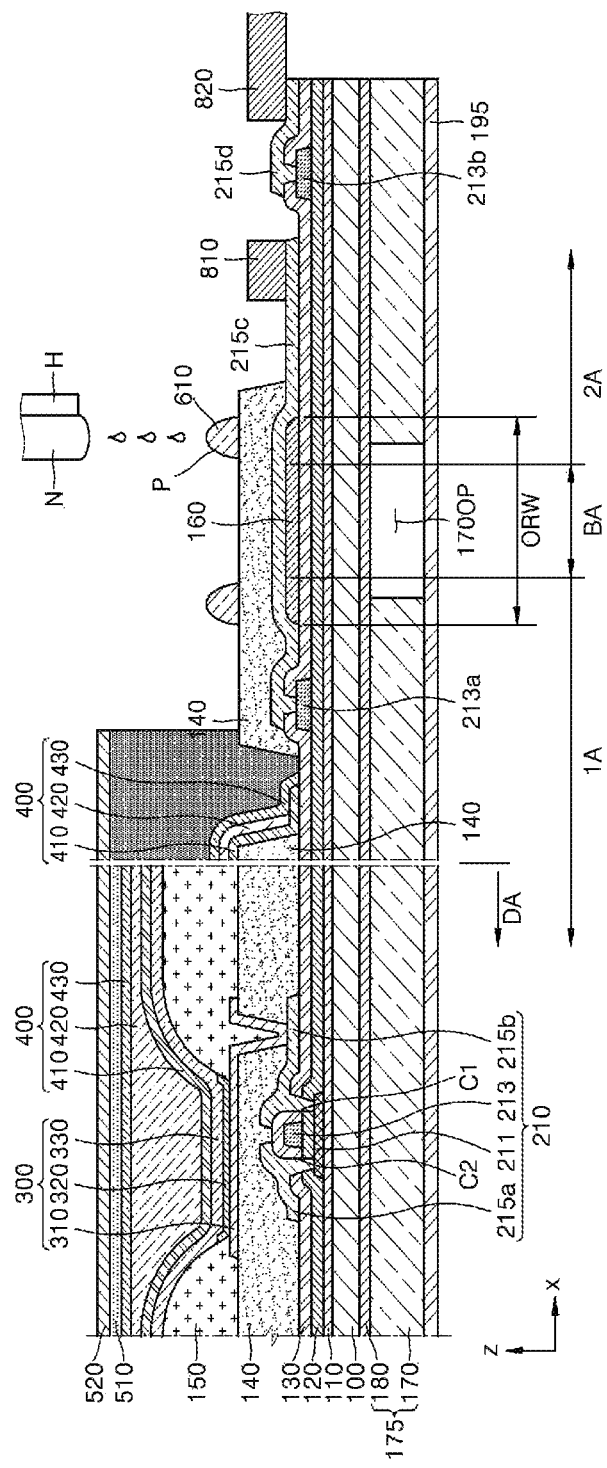
FIG. 8 is a cross-sectional view for describing a manufacturing sequence of the display apparatus of FIG. 1 according to an example embodiment.
Figure 9:
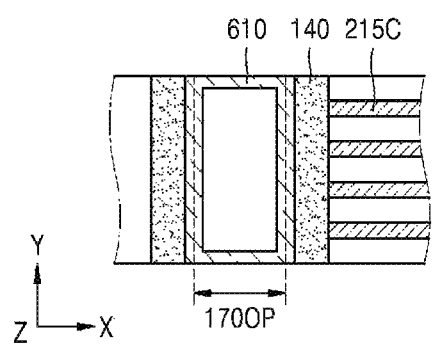
FIG. 9 is a plan view of a first bending protection layer of FIG. 8 according to an example embodiment.

FIG. 8 is a cross-sectional view for describing a manufacturing sequence of the display apparatus of FIG. 1. FIG. 9 is a plan view of a first bending protection layer 610 of FIG. 8.

Referring to FIGS. 8 and 9, a carrier film 195 may be attached onto a lower portion of the protection film 175 after the opening 170OP is formed in the protection film 175 as described above. In this regard, the carrier film 195 may be attached by pressing a surface of the carrier film 195 in a direction (+z direction) of an upper surface of the substrate 100 by using a roller, etc.

After the carrier film 195 is attached as described above, a polarizer 520 may be arranged over the encapsulation layer 400. In this regard, the polarizer 520 may be formed in the form of a film to be attached onto the encapsulation layer 400 or to be formed in the form of a layer in the encapsulation layer 400. For convenience of description, a case where the polarizer 520 is formed in the form of the film will be described in detail below.

Specifically, the polarizer 520 may be attached onto the encapsulation layer 400 by using a translucency optically clear adhesive (OCA) 510 after the polarizer 520 is arranged over the encapsulation layer 400. The polarizer 520 may reduce reflection of external light. For example, when external light transmits through the polarizer 520, the external light is reflected from an upper surface of the opposite electrode 330, and then transmitted through the polarizer 520 again; since the external light transmits through the polarizer 520 twice, a phase of the external light may be changed. As a result, a phase of reflection light may be different from a phase of external light entering into the polarizer 520, which causes an extinction interference, and thus the reflection of external light may be reduced, thereby enhancing visibility. The translucency OCA 510 and the polarizer 520 may cover an opening of the planarization layer 140. The display apparatus according to the present embodiment may not necessarily include the polarizer 520. The polarizer 520 may be omitted if necessary and may be replaced with other components. For example, the polarizer 520 may be omitted, and the reflection of external light may be reduced by using a black matrix or a color filter.

A process of forming a touch electrode of various patterns for a function of a touch screen over the encapsulation layer 400 or forming a touch protection layer for protecting the touch electrode may be further performed if necessary. In addition, a function layer (not shown) having a function of scratch resistance, chemical property resistance, etc. may be arranged over the encapsulation layer 400.

In addition to the above-described various configurations, a driving circuit chip 810 may be formed (or arranged) over a display panel. The display panel and a ductile circuit 820 may be connected.

In this regard, the driving circuit chip 810 and/or the ductile circuit 820 may be attached onto the second area 2A. The driving circuit chip 810 and/or the ductile circuit 820 may be connected to the first conductive layer 215c, the second conductive layer 213b, and the third conductive layer 215d that are arranged in the second area 2A and/or other conductive layers electrically connected to the first conductive layer 215c, the second conductive layer 213b, and the third conductive layer 215d. The driving circuit chip 810 and/or the ductile circuit 820 may provide a driving signal to the display area DA through the first conductive layer 215c, the second conductive layer 213b, the third conductive layer 215d, and other conductive layers. The driving signal may mean a driving voltage and various signals driving the display apparatus such as a gate signal, a data signal, etc. In FIG. 8, the driving circuit chip 810 is mounted in an edge of the first conductive layer 215c, and the ductile circuit 820 is connected to an edge of the third conductive layer 215d. However, the disclosure is not limited thereto. The driving circuit chip 810 and the ductile circuit 820 may be connected to the second conductive layer 213b or other conductive layers.

In an example embodiment, the driving circuit chip 810 and/or the ductile circuit 820 may be attached to the conductive layer by applying pressure and heat to the driving circuit chip 810 and/or the ductile circuit 820 via a pressure bonding apparatus PB. In this regard, an anisotropic conducting film (ACF) may be used. The ACF may include a double-sided tape in which an adhesive cured by heat and fine conductive particles are distributed and mixed. Thus, if pressure is applied to upper and lower portions of the ACF, conductive particles burst and the adhesive contained therein fills the double-sided tape, and thus the ACF may simultaneously have conductivity and adhesion.

The polarizer 520, the touch electrode, the function layer, and the driving circuit chip 810 may be formed and the ductile circuit 820 and the display panel may be connected to each other after the opening 170OP is formed and the carrier film 195 is attached. In another embodiment, the polarizer 520, the touch electrode, the function layer, and the driving circuit chip 810 may be formed and the ductile circuit 820 and the display panel may be connected to each other after one display panel is manufactured. However, for convenience of description, a case where the polarizer 520, the touch electrode, the function layer, and the driving circuit chip 810 are formed and the ductile circuit 820 and the display panel are connected to each other after the opening 170OP is formed and the carrier film 195 is attached onto the protection film 175 will be described in detail below.

If the above-described process is complete, the first bending protection layer 610 may be formed over the display panel. In this regard, the first bending protection layer 610 is formed after a process of bonding the driving circuit chip 810 and/or the ductile circuit 820 but the disclosure is not limited thereto. The first bending protection layer 610 may be formed before the process of bonding the driving circuit chip 810 and/or the ductile circuit 820. However, for convenience of description, a case where the first bending protection layer 610 is formed after the process of bonding the driving circuit chip 810 and/or the ductile circuit 820 will be described in detail below.

In detail, the first bending protection layer 610 may be coated on the display panel through a nozzle N. In this case, the first bending protection layer 610 may be coated by the nozzle N in a line shape in one direction (for example, an X direction of FIG. 8 or a Y direction of FIG. 1). After the first bending protection layer 610 is coated, a hardener H attached onto the nozzle N may harden the first bending protection layer 610. In this regard, the hardener H may harden the first bending protection layer 610 through heat, laser, and/or ultraviolet rays (UV).

The above-described processes may be continuously performed in a boundary of an area in which the bending protection layer 600 is to be formed. In this case, the first bending protection layer 610 may be arranged in at least a part of the boundary of the area of the bending protection layer 600. However, for convenience of description, a case where the first bending protection layer 610 surrounds the boundary of the area of the bending protection layer 600 will be described in detail below.

In this case, the first bending protection layer 610 may form a closed loop. In this regard, a display panel area arranged in an upper surface of the opening 170OP may be arranged in the first bending protection layer 610. A space may be formed in the first bending protection layer 610. That is, a shape of the first bending protection layer 610 may be the same as or similar to that of a dam.

When the first bending protection layer 610 is formed, the first bending protection layer 610 may be arranged in at least a part of a boundary of the opening 170OP or outside the boundary of the opening 170OP. That is, a part of the first bending protection layer 610 may be arranged over the display panel in order to overlap the opening 170OP or in order not to overlap the opening 170OP (for example, when the first bending protection layer 610 is arranged outside the opening 170OP).

A highest point P of the first bending protection layer 610 may be arranged outside the boundary of the opening 170OP. For example, the highest point P of the first bending protection layer 610 may not overlap the opening 170OP.

In another embodiment, the first bending protection layer 610 may be arranged outside the bending area BA or outside the opening 170OP in order not to overlap the bending area BA or the opening 170OP. In this case, one of the first bending protection layers 610 may be arranged in the second area 2A and another one may be arranged between the opening 170OP and the display area DA.

However, for convenience of description, a case where a part of the first bending protection layer 610 is arranged over the display panel in order to overlap the opening 170OP will be described in detail below.

Figure 10:
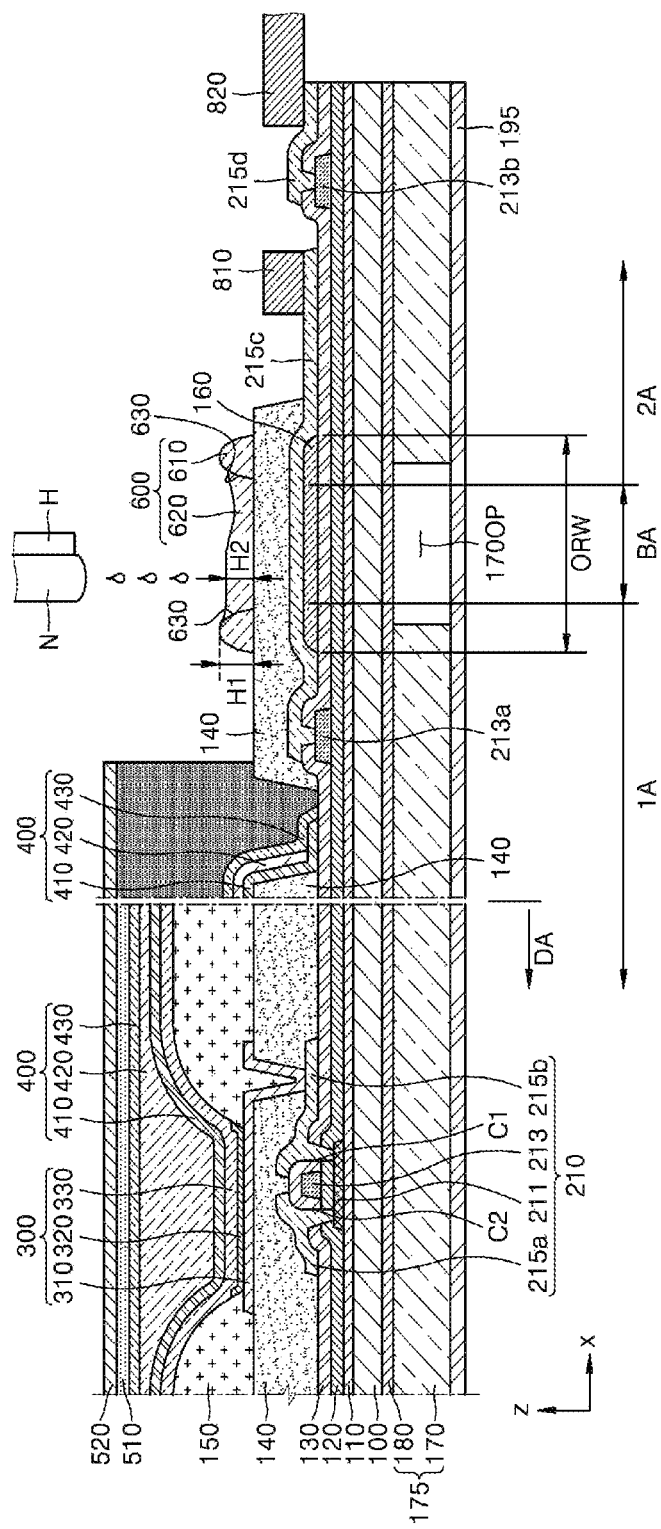
FIG. 10 is a cross-sectional view for describing a manufacturing sequence of the display apparatus of FIG. 1 according to an example embodiment.
Figure 11:
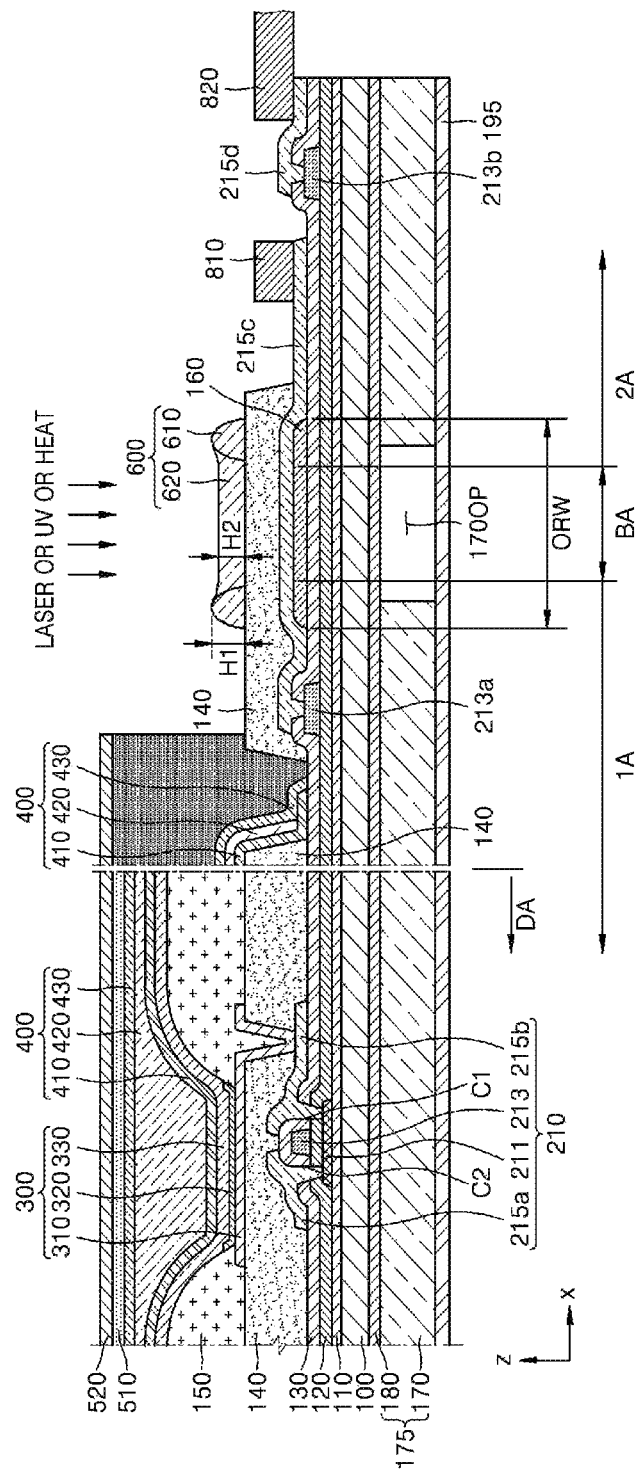
FIG. 11 is a cross-sectional view for describing a manufacturing sequence of the display apparatus of FIG. 1 according to an example embodiment.

FIG. 10 is a cross-sectional view for describing a manufacturing sequence of the display apparatus of FIG. 1. FIG. 11 is a cross-sectional view for describing a manufacturing sequence of the display apparatus of FIG. 1.

Referring to FIGS. 10 and 11, after the first bending protection layer 610 is formed as described above, a second bending protection layer 620 may be coated. In this regard, the nozzle N may spray the second bending protection layer 620 to a space formed in the first bending protection layer 610.

When the second bending protection layer 620 is formed, the second bending protection layer 620 may flow in the space of the first bending protection layer 610 while not being hardened. In this case, the second bending protection layer 620 may fill the space of the first bending protection layer 610.

A maximum height H2 of the coated second bending protection layer 620 may be lower than a maximum height H1 of the first bending protection layer 610. In this regard, a part of the second bending protection layer 620 may overlap the first bending protection layer 610.

If the second bending protection layer 620 is completely coated as described above, the second bending protection layer 620 may be hardened. In this regard, the second bending protection layer 620 may be hardened through the hardener H attached onto the nozzle N or a hardening unit separately from the hardener H. A method of hardening the second bending protection layer 620 is the same as or similar to a method of hardening the first bending protection layer 610, and thus a detailed description thereof is omitted.

If the second bending protection layer 620 is completely hardened as described above, the bending protection layer 600 may be formed in the display panel over the opening 170OP. In this regard, the second bending protection layer 620 may be hardened after the first bending protection layer 610 is hardened, and thus a boundary 630 between the first bending protection layer 610 and the second bending protection layer 620 may be formed along an outer surface of the first bending protection layer 610. In particular, the first bending protection layer 610 may be distinguished from the second bending protection layer 620 via the boundary 630.

An area of the bending protection layer 600 may be greater than an area of the bending area BA and an area of the opening 170OP. A thickness of the bending protection layer 600 may be uniformly maintained in the bending area BA or the opening 170OP. One surface of the bending protection layer 600 may be exposed to the outside.

When the thickness of the bending protection layer 600 is not uniform, a curvature radius may not be uniform and there may be a high possibility that cracks occur in the bending area BA when the substrate 100 is bent. However, the above-formed bending protection layer 600 may have a uniform thickness in the bending area BA or the opening 170OP.

The bending protection layer 600 may minimize tensile stress when the bending area BA is bent. When a stack structure is bent, a stress neutral plane is present in the stack structure. If the bending protection layer 600 is not present, excess tensile stress may be applied to the first conductive layer 215c in the bending area BA according to bending of the substrate 100 that will be described later. This is because a location of the first conductive layer 215c may not correspond to the stress neutral plane. However, if the bending protection layer 600 is present and a thickness and modulus thereof are adjusted, a location of the stress neutral plane of a stack structure including all the substrate 100, the first conductive layer 215c, and the bending protection layer 600 may be adjusted. Thus, the stress neutral plane may be located near the first conductive layer 215c through the bending protection layer 600, thereby minimizing tensile stress applied to the first conductive layer 215c and protecting the bending area BA.

When the bending area BA is bent, a stress may be concentrated on a small thickness part of the bending protection layer 600. In particular, the small thickness part may frequently appear in a part in which the first bending protection layer 610 is formed. In this regard, when the first bending protection layer 610 and the second bending protection layer 620 are simultaneously hardened after being simultaneously or sequentially coated, since the first bending protection layer 610 may be unbent, a thickness of the first bending protection layer 610 arranged in an outermost area of the bending protection layer 600 may be reduced. In this case, when the bending area BA is bent, since cracks occur in an outermost part of the first bending protection layer 610, the bending protection layer 600 may be separated from the display panel. However, the first bending protection layer 610 may be almost simultaneously coated and hardened as described above, the first bending protection layer 610 may be unbent, which may prevent a thickness of the outermost part of the first bending protection layer 610 from being greatly reduced, thereby avoiding concentration of stress.

The first bending protection layer 610 and the second bending protection layer 620 may include the same material. In another embodiment, the first bending protection layer 610 and the second bending protection layer 620 may include different materials. In particular, when the first bending protection layer 610 and the second bending protection layer 620 include different materials, when the first bending protection layer 610 and the second bending protection layer 620 are hardened, the first bending protection layer 610 and the second bending protection layer 620 may have different colors, density, hardness, etc.

In FIG. 11, an upper surface of the bending protection layer 600 in a direction (−x direction) of the display area DA is not in contact with the polarizer 520 and/or the OCA 510 but the disclosure is not limited thereto. For example, an edge of the bending protection layer 600 in the direction (−x direction) of the display area DA may cover a part of an upper surface of an edge of the polarizer 520. Alternatively, the edge of the bending protection layer 600 in the direction (−x direction) of the display area DA may be identical to an upper surface of the polarizer 520 (+z direction).

Figure 12:
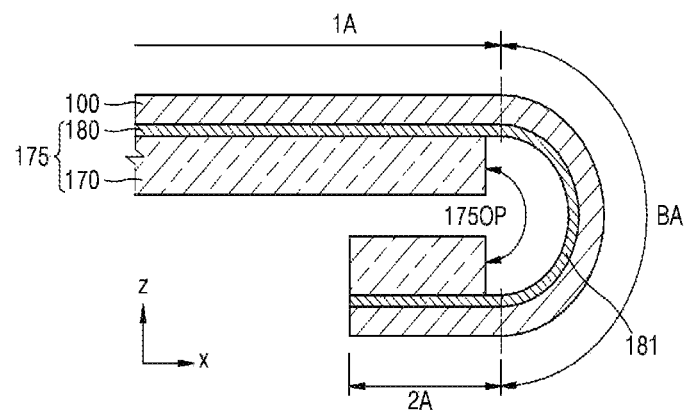
FIG. 12 is a schematic cross-sectional view of a substrate and a protection film of FIG. 1 according to an example embodiment.

FIG. 12 is a schematic cross-sectional view of the substrate 100 and the protection film 175 of FIG. 1.

Referring to FIG. 12, after a bending protection layer (not shown) is formed as described above, the substrate 100 may be bent with respect to a bending axis (not shown). The substrate 100 may be bent in the bending area BA. The protection film base 170 of the protection film 175 may protect a lower surface of the substrate 100 and thus have rigidity itself. Accordingly, when the protection film base 170 has a low flexibility, if the substrate 100 is bent, the protection film base 170 may be separated from the substrate 100. However, in the display apparatus according to the present embodiment, the protection film 175 may have the opening 170OP corresponding to the bending area BA, thereby effectively preventing the protection film base 170 from being separated from the substrate 100.

It is described above that the protection film 175 has the opening 170OP corresponding to the bending area BA and is attached onto the lower surface of the substrate 100 in the first area 1A and the second area 2A but the disclosure is not limited thereto. For example, the protection film 175 may correspond to only at least a part of the first area 1A of the substrate 100. That is, the protection film 175 may not be present in the second area 2A of the substrate 100.

In the example embodiments, the substrate 100 is bent with respect to a bending axis so that a part of a lower surface of the first area 1A and at least a part of a lower surface of the second area 2A face each other but the embodiments are not limited thereto. Thus, various modifications may be possible, for example, a curvature of the bending area BA may be smaller as shown in the drawings or although there is no big change in the curvature of the bending area BA, since the bending area BA has a small area, the lower surface of the first area 1A and the lower surface of the second area 2A may not face each other. However, for convenience of description, a case wherein the lower surface of the first area 1A and the lower surface of the second area 2A face each other will be described in detail below.

Figure 13:
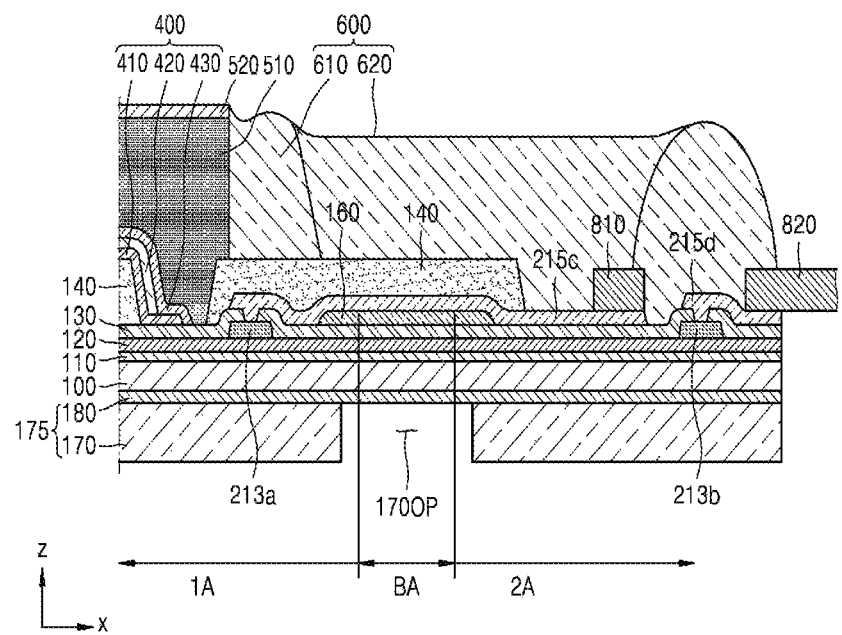
FIG. 13 is a cross-sectional view of a display apparatus according to another embodiment.
Figure 14:
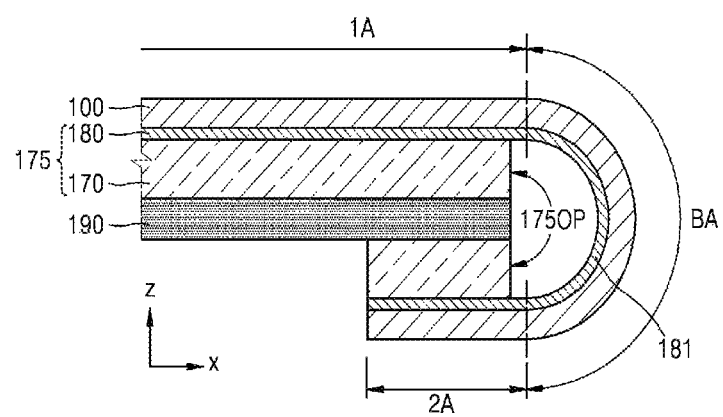
FIG. 14 is a schematic cross-sectional view of a substrate, a protection film, and a cushion layer of the display apparatus of FIG. 13 according to an example embodiment.

FIG. 13 is a cross-sectional view of a display apparatus according to another embodiment. FIG. 14 is a schematic cross-sectional view of the substrate 100, the protection film 175, and a cushion layer 190 of the display apparatus of FIG. 13.

Referring to FIGS. 13 and 14, the bending protection layer 600 of the display apparatus may extend to an edge of the substrate 100 of the display apparatus as shown in FIG. 13. For example, at least some of the first conductive layer 215c, the second conductive layer 213b, and/or other conductive layers electrically connected to the first conductive layer 215c and the second conductive layer 213b may not be covered by the interlayer insulating layer 130 or the planarization layer 140 in the second area 2A but may be electrically connected to the driving circuit chip 810 or the ductile circuit 820. In this regard, an electrically connected portion may be necessarily protected from impurities such as external moisture. Thus, the bending protection layer 600 may cover the electrically connected portion, and thus the bending protection layer 600 may function as a protection layer. In FIG. 13, the bending protection layer 600 covers partially the driving circuit chip 810 and the ductile circuit 820 but various modifications may be possible. The bending protection layer 600 may cover the driving circuit chip 810 while not covering the ductile circuit 820.

The bending protection layer 600 may include the first bending protection layer 610 and the second bending protection layer 620 in a boundary area of the bending protection layer 600. In this regard, the first bending protection layer 610 and the second bending protection layer 620 may be formed in the same or similar way as described above, and thus detailed descriptions thereof are omitted.

After the substrate 100 is bent, the cushion layer 190 may be further arranged in an area facing the first area 1A and the second area 2A. That is, the cushion layer 190 may be in contact with portion of the protection film base 170 at the first area 1A and portion of the protection film base 170 at the second area 2A. After the substrate 100 is bent, the cushion layer 190 may be arranged in a space in which the first area 1A and the second area 2A are spaced apart from each other, may support a display panel, and may absorb shock. The cushion layer 190 may include an elastic material. In this regard, the display apparatus is not limited thereto. The cushion layer 190 may be attached onto the protection film base 170 before the substrate 100 is bent.

Figure 15:
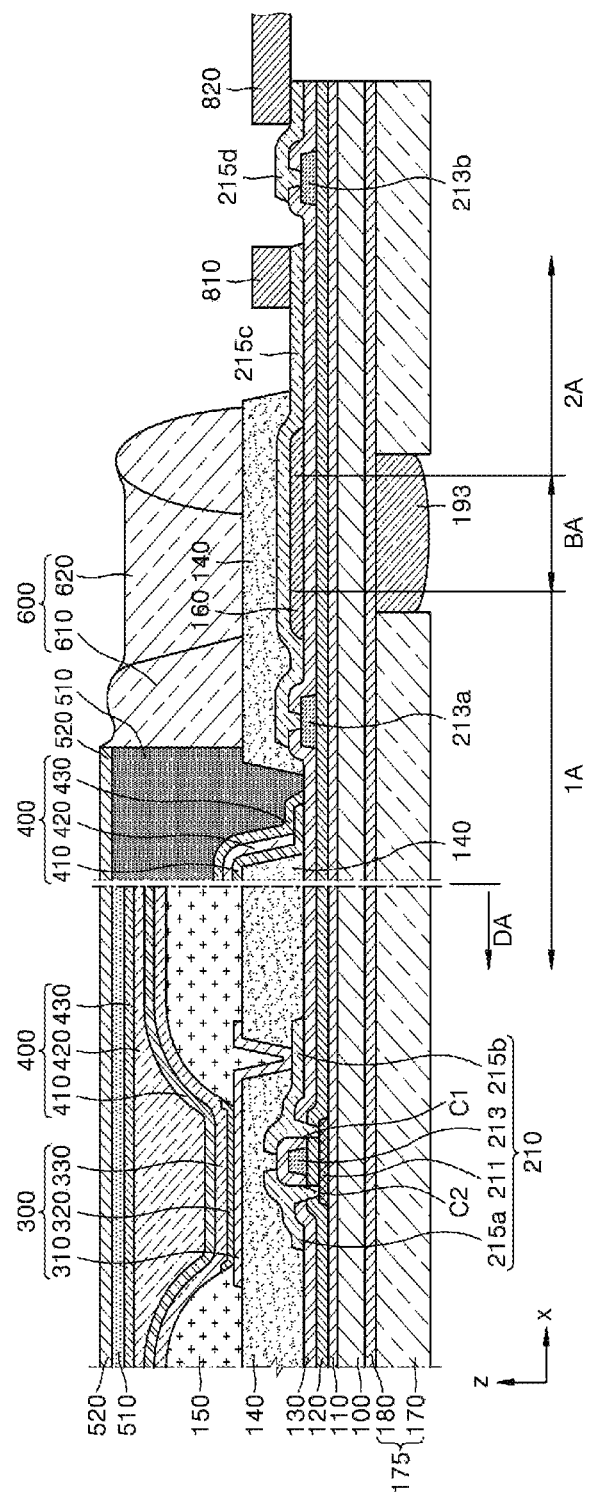
FIG. 15 is a cross-sectional view of a display apparatus according to another example embodiment.
Figure 16:
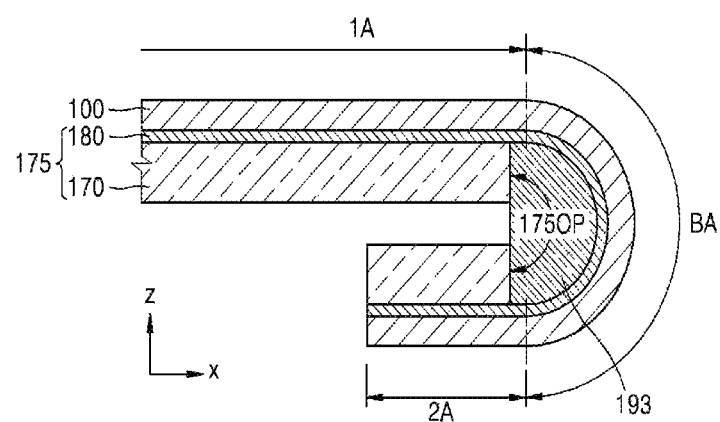
FIG. 16 is a schematic cross-sectional view of a substrate, a protection film, and a filler of the display apparatus of FIG. 15 according to another example embodiment.

FIG. 15 is a cross-sectional view of a display apparatus according to another embodiment. FIG. 16 is a schematic cross-sectional view of the substrate 100, the protection film 175, and a filler 193 of the display apparatus of FIG. 15.

Referring to FIGS. 15 and 16, the bending protection layer 600 of the display apparatus may be formed in a similar way as shown in FIG. 13. In this regard, the bending protection layer 600 may include the first bending protection layer 610 forming a dam outside and the second bending protection layer 620 arranged inside the first bending protection layer 610.

The filler 193 may be further arranged in the opening 170OP of the protection film 175. The filler 193 may be formed by injecting and curing a liquefied or paste material in the opening 170OP of the protection film 175. The filler 193 may be cured by irradiating UV light or applying heat thereto. The filler 193 may include a viscous material and may be cured by UV light or heat, thereby preventing or minimizing the substrate 100 from being deformed due to a restoring force of the substrate 100 to a state before the substrate 100 is bent.

The filler 193 may be injected after the substrate 100 is bent but, in another embodiment, the liquefied or paste filler 193 may be injected after the opening 170OP is formed. In this regard, the substrate 100 may be bent before the liquefied or paste filler 193 may be cured. Thereafter, the filler 193 may be cured by irradiating with UV or applying heat to the liquefied or paste filler 193.

Figure 17:
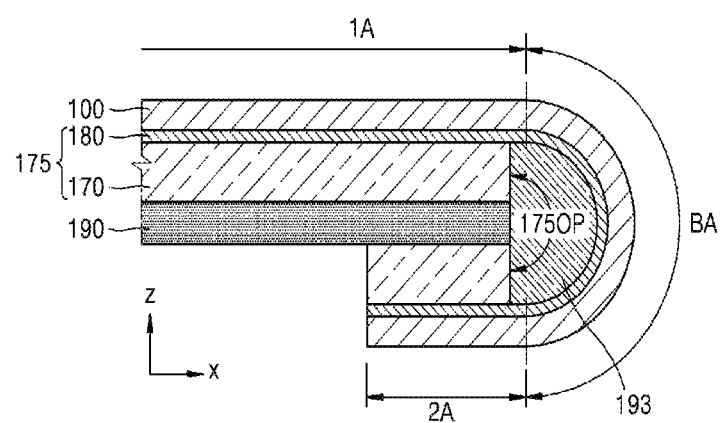
FIG. 17 is a cross-sectional view of a substrate, a protection film, a filler, and a cushion layer of a display apparatus according to another example embodiment.

FIG. 17 is a cross-sectional view of the substrate 100, the protection film 175, the filler 193, and the cushion layer 190 of a display apparatus according to another embodiment.

Referring to FIG. 17, the filler 193 may be used together with the cushion layer 190. In this case, after the substrate 100 is bent, the filler 193 and the cushion layer 190 may be arranged. In another embodiment, before the substrate 100 is bent, the filler 193 and the cushion layer 190 may be arranged. In this regard, the disclosure is not limited thereto. The filler 193 and the cushion layer 190 may be arranged by using various methods.

Figure 18:
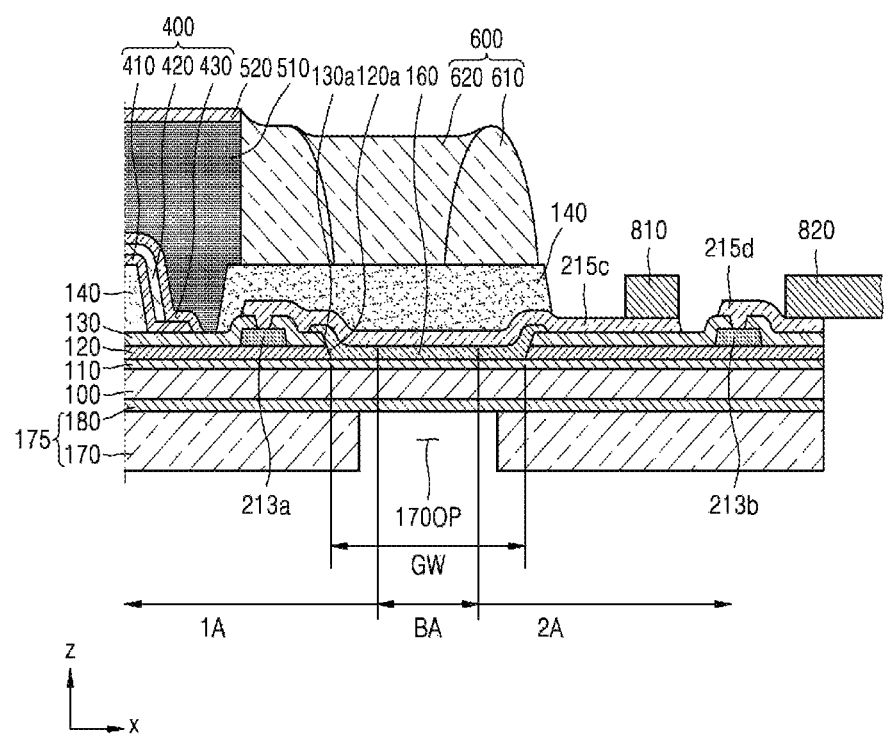
FIG. 18 is a cross-sectional view of a display apparatus according to another example embodiment.

FIG. 18 is a cross-sectional view of a display apparatus according to another embodiment.

Referring to FIG. 18, the display apparatus may include the bending protection layer 600 overlapping the bending area BA. In this regard, the bending protection layer 600 may include the first bending protection layer 610 and the second bending protection layer 620 that are connected to each other. The first bending protection layer 610 and the second bending protection layer 620 may be formed in the same or similar way as described above, and thus detailed descriptions thereof are omitted.

The bending protection layer 600 may overlap the bending area BA and may be arranged over the planarization layer 140. In this regard, the bending protection layer 600 may be partially in contact with the OCA 510 and the polarizer 520.

It is described above that an inorganic insulating layer has a flat upper surface in an area in which the inorganic insulating layer and an organic insulating layer overlap but the disclosure is not limited thereto. For example, as shown in FIG. 18, the inorganic insulating layer may have a groove in a location corresponding to the bending area BA.

The buffer layer 110 may be discontinuous in the first area 1A, the bending area BA, and the second area 2A. The gate insulating layer 120 may have an opening 120a corresponding to the bending area BA. The interlayer insulating layer 130 may also have an opening 130a corresponding to the bending area BA. Accordingly, the inorganic insulating layer including the buffer layer 110, the gate insulating layer 120, and the interlayer insulating layer 130 may be understood to have a groove corresponding to the bending area BA. The inorganic insulating layer may have a groove in different and various shapes. For example, an upper surface of the buffer layer 110 (+z direction) may be partially removed. Unlike the illustration, a lower surface of the gate insulating layer 120 (−z direction) may not be removed and various modifications may be possible. The groove may be formed simultaneously with a patterning process for forming the contact holes C2 and C1 that connect the source electrode 215a and the drain electrode 215b of the TFT 210 to the semiconductor layer 211.

The groove corresponding to the bending area BA may be a groove overlapping the bending area BA. In this regard, an area of the groove may be greater than that of the bending area BA. To this end, in FIG. 18, a width GW of the groove is greater than a width of the bending area BA. In this regard, the area of the groove may be defined as an area of an opening having a smallest area from among the openings 120a and 130a of the gate insulating layer 120 and the interlayer insulating layer 130. In FIG. 18, the area of the groove is defined by an area of the opening 120a of the gate insulating layer 120. In the display apparatus according to the present embodiment, the organic material layer 160 may be interposed between the inorganic insulating layer and the first conductive layer 215c and may fill the groove.

Although the display apparatus is not bent in FIG. 18 for convenience of illustration, in the display apparatus according to the present embodiment, the substrate 100 may be bent in the bending area BA as shown in FIG. 1. To this end, during a manufacturing process, the substrate 100 may be made approximately flat and then may be bent in the bending area BA, and thus the display apparatus may have a shape as shown in FIG. 1. In this regard, during a process of bending the substrate 100 in the bending area BA, although tensile stress may be applied to the first conductive layer 215c, in the display apparatus according to the present embodiment, the inorganic insulating layer may have the groove in the bending area BA, and the bending area BA of the first conductive layer 215c may be located over the organic material layer 160 that fills at least a part of the groove of the inorganic insulating layer. Thus, cracks may be prevented from occurring in the bending area BA of the first conductive layer 215c located over the organic material layer 160 or an occurrence rate of cracks may be minimized.

Since hardness of the inorganic insulating layer is higher than that of the organic material layer 160, there may be a high probability that cracks occur in the inorganic insulating layer in the bending area BA. When cracks occur in the inorganic insulating layer, there may be a high probability that cracks are diffused to the first conductive layer 215c. Although diffusion of cracks may be prevented by the organic material layer 160, since the groove is formed in the inorganic insulating layer, a probability that cracks occur in the inorganic insulating layer may be further reduced. Thus, concentration of tensile stress on the first conductive layer 215c may be minimized.

Figure 19:
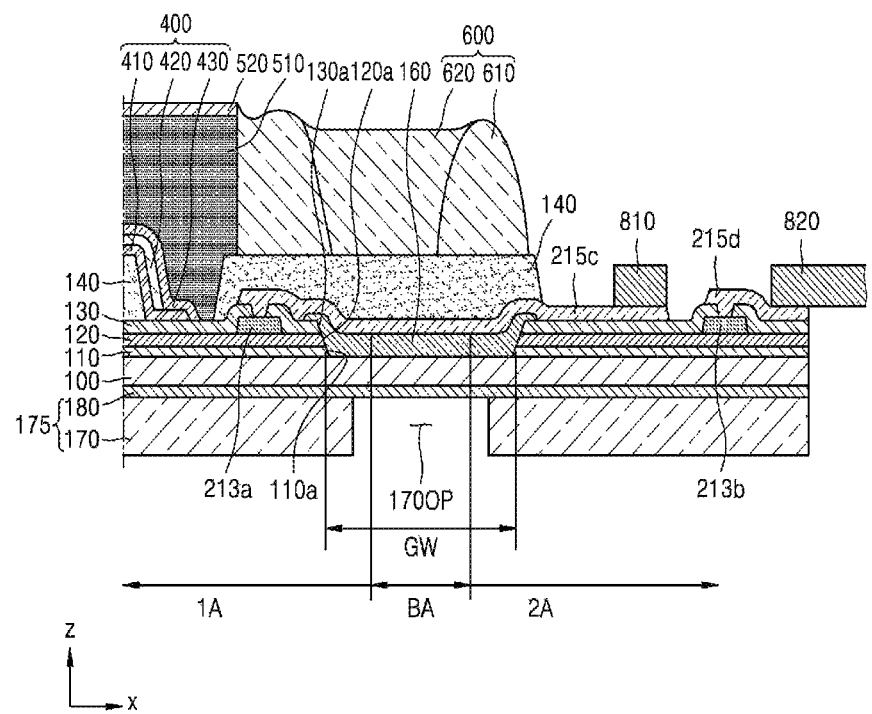
FIG. 19 is a cross-sectional view of a display apparatus according to another example embodiment.

FIG. 19 is a cross-sectional view of a display apparatus according to another embodiment.

Referring to FIG. 19, the display apparatus may include the bending protection layer 600 to correspond to the bending area BA. The bending protection layer 600 may include the first bending protection layer 610 and the second bending protection layer 620 that are distinguished from each other. In this regard, the first bending protection layer 610 and the second bending protection layer 620 may be formed in the same or similar way as described above, and thus detailed descriptions thereof are omitted.

An inorganic insulating layer may have an opening at a location corresponding to the bending area BA.

The buffer layer 110, the gate insulating layer 120, and the interlayer insulating layer 130 may respectively have the openings 110a, 120a, and 130a corresponding to the bending area BA. The opening corresponding to the bending area BA may be an opening overlapping the bending area BA. In this regard, an area of the opening may be greater than that of the bending area BA. To this end, in FIG. 19, the width GW of the opening is greater than a width of the bending area BA. In this regard, the area of the opening may be defined as an area of an opening having the smallest area from among the openings 110a, 120a, and 130a of the buffer layer 110, the gate insulating layer 120 and the interlayer insulating layer 130. In FIG. 19, the area of the opening is defined by an area of the opening 110a of the buffer layer 110.

When a display unit DU described above is formed, the organic material layer 160 that fills at least a part of the opening of the inorganic insulating layer may be formed. In the display apparatus according to the present embodiment, as described above, the inorganic insulating layer may have the opening in the bending area BA, and the bending area BA of the first conductive layer 215c may be located over the organic material layer 160 that fills at least a part of the opening of the inorganic insulating layer. Since the inorganic insulating layer has the opening in the bending area BA, a probability that cracks occur in the inorganic insulating layer may be further reduced. There may be a very low probability that cracks occur in the organic material layer 160 since the organic material layer 160 includes an organic material. Thus, cracks may be prevented from occurring in the bending area BA of the first conductive layer 215c located over the organic material layer 160 or an occurrence rate of cracks may be minimized. Since hardness of the organic material layer 160 is lower than that of the inorganic insulating layer, the organic material layer 160 may absorb tensile stress generated when the substrate 100 is bent, and thus concentration of tensile stress on the first conductive layer 215c may be minimized.

Figure 20:
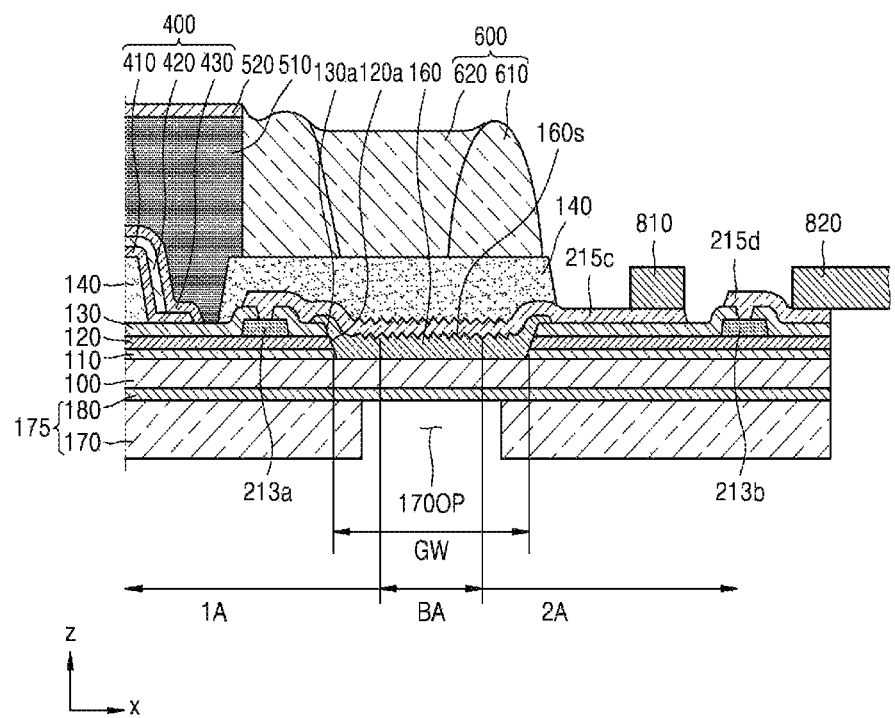
FIG. 20 is a cross-sectional view of a display apparatus according to another example embodiment.

FIG. 20 is a cross-sectional view of a display apparatus according to another embodiment.

Referring to FIG. 20, the display apparatus may include the bending protection layer 600 to correspond to the bending area BA. The bending protection layer 600 may include the first bending protection layer 610 and the second bending protection layer 620 that are distinguished from each other. In this regard, the first bending protection layer 610 and the second bending protection layer 620 may be formed in the same or similar way as described above, and thus detailed descriptions thereof are omitted.

The organic material layer 160 may have an uneven surface 160s in at least a part of an upper surface thereof (+z direction). The organic material layer 160 may have the uneven surface 160s so that an upper surface and/or a lower surface of the first conductive layer 215c located over the organic material layer 160 may have a shape corresponding to the uneven surface 160s of the organic material layer 160.

As described above, during a manufacturing process, when the substrate 100 is bent in the bending area BA, tensile stress may be applied to the first conductive layer 215c, and thus the upper surface and/or the lower surface of the first conductive layer 215c may have the shape corresponding to the uneven surface 160s of the organic material layer 160, thereby minimizing an amount of the tensile stress may be applied to the first conductive layer 215c. That is, the tensile stress that may be generated during a bending process may be reduced by deforming a shape of the organic material layer 160 having a low strength. In this regard, at least before the substrate 100 is bent, the first conductive layer 215c having an uneven shape may be deformed in order to correspond to the shape of the organic material layer 160 that is deformed due to bending, thereby effectively preventing defects such as a disconnection of the first conductive layer 215c.

The uneven surface 160s may be formed in the at least a part of the upper surface of the organic material layer 160 (+z direction), and thus, a surface area of the upper surface of the organic material layer 160 may be greater than that of upper and lower surfaces of the first conductive layer 215c in a first opening. As the surface area of the upper surface of the organic material layer 160 is greater than at least one of the areas of the upper and lower surfaces of the first conductive layer 215c, a deformation amount of the organic material layer 160 and the first conductive layer 215c may increase, which reduce a tensile stress generated by bending of the substrate 100.

Since the first conductive layer 215c is located in the organic material layer 160, the lower surface of the first conductive layer 215c may have a shape corresponding to the uneven surface 160s of the organic material layer 160, whereas the upper surface of the first conductive layer 215c may have an uneven surface in an independent shape that does not correspond to the uneven surface 160s of the organic material layer 160.

The organic material layer 160 may be formed in the same or similar way as described above not only in the case in which an inorganic insulating layer having an uneven surface includes an opening but also in a case wherein the inorganic insulating layer has a flat upper surface in an area in which the inorganic insulating layer and the organic material layer 160 overlap and a case wherein the inorganic insulating layer includes a groove.

In the display apparatus according to the above-described embodiments, structures, manufacturing methods, or characteristics explained in the above-described embodiments regarding the protection film 175 including the protection film base 170 and the viscous layer 180 may be applied.

Figure 21:
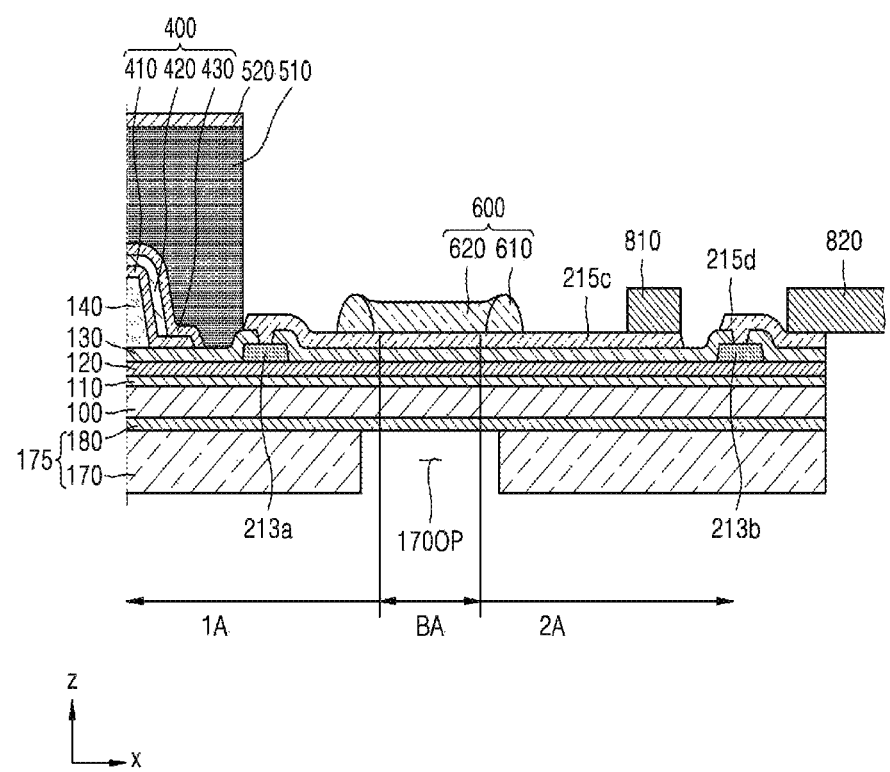
FIG. 21 is a cross-sectional view of a display apparatus according to another example embodiment.

FIG. 21 is a cross-sectional view of a display apparatus according to another example embodiment.

Referring to FIG. 21, an organic material layer (not shown) described above may not be present in the display apparatus. In this case, the interlayer insulating layer 130 arranged in a lower surface of the first conductive layer 215c and the gate insulating layer 120 arranged in a lower surface of the interlayer insulating layer 130 may be flat as shown in FIG. 21.

In this regard, when the organic material layer is not present, structures, manufacturing methods, or characteristics explained in the above-described embodiments regarding the protection film 175 including the protection film base 170 and the viscous layer 180 may be applied.

The display apparatus may not include a planarization layer (not shown) and thus the first conductive layer 215c may be exposed to the outside in the bending area BA. In this case, the bending protection layer 600 may shield a part of the first conductive layer 215c.

The bending protection layer 600 may include the first bending protection layer 610 and the second bending protection layer 620 that are distinguished from each other. In this regard, the first bending protection layer 610 and the second bending protection layer 620 may be formed in the same or similar way as described in FIGS. 1 through 13, and thus detailed descriptions thereof are omitted.

The bending protection layer 600 may be formed as shown in FIG. 21, but the example embodiments are not limited thereto. In another embodiment, the display apparatus as described above may not include the organic material layer, may include the planarization layer, and may include the bending protection layer 600 over the planarization layer.

The bending protection layer 600 may be formed in contact with the OCA 510 and the polarizer 520.

Figure 22:
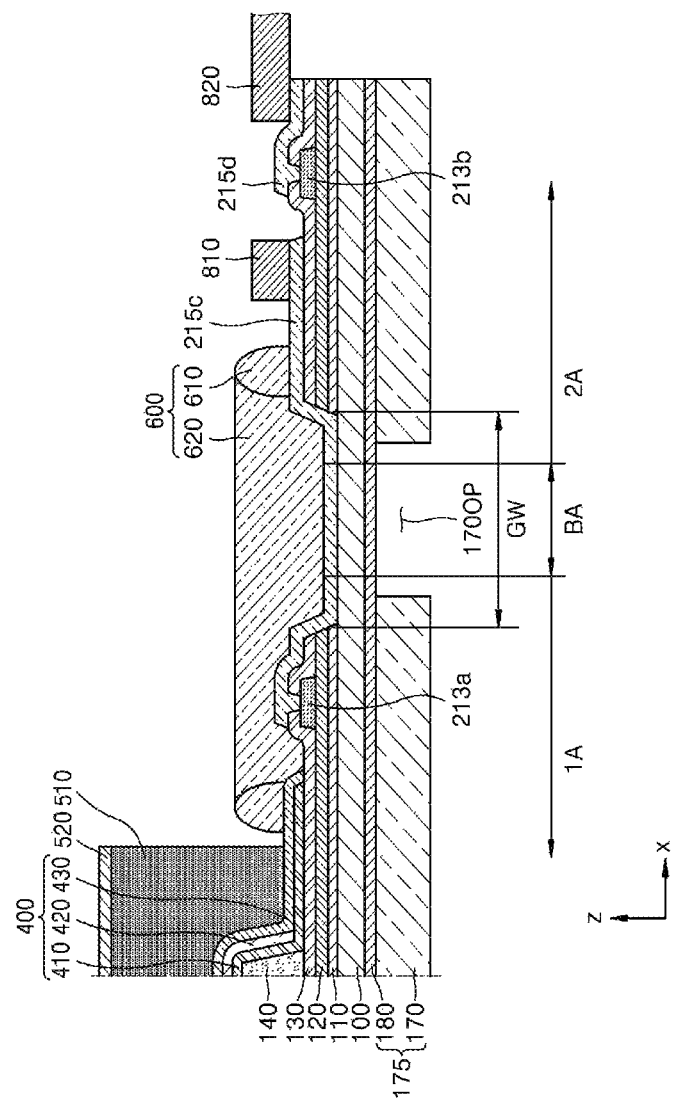
FIG. 22 is a cross-sectional view of a display apparatus according to another example embodiment.
Figure 23:
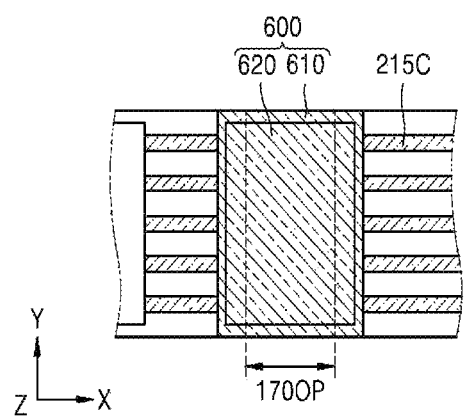
FIG. 23 is a plan view for describing a sequence of forming a bending protection layer when the display apparatus of FIG. 22 is manufactured according to another example embodiment.
Figure 24:
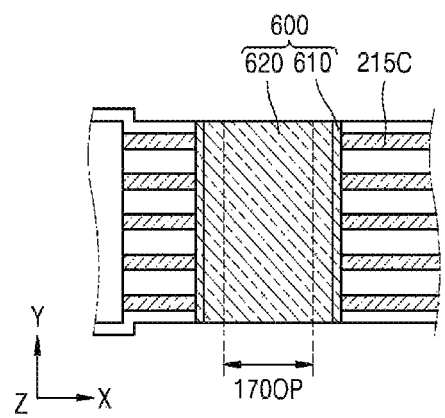
FIG. 24 is a plan view for describing a sequence of forming a bending protection layer when the display apparatus of FIG. 22 is manufactured according to another example embodiment.

FIG. 22 is a cross-sectional view of a display apparatus according to another example embodiment. FIG. 23 is a plan view for describing a sequence of forming the bending protection layer 600 when the display apparatus of FIG. 22 is manufactured. FIG. 24 is a plan view for describing a sequence of forming the bending protection layer 600 when the display apparatus of FIG. 22 is manufactured.

Referring to FIGS. 22 through 24, the display apparatus may not include an organic material layer (not shown) described above. The display apparatus may include a planarization layer (not shown) described above.

In this case, in an embodiment, the interlayer insulating layer 130 arranged in a lower surface of the first conductive layer 215c, the gate insulating layer 120 arranged in a lower surface of the interlayer insulating layer 130, and the buffer layer 110 arranged in a lower surface of the gate insulating layer 120 may be removed so that a hole may be formed as shown in FIG. 22. In another embodiment, a part of the interlayer insulating layer 130 and a part of the gate insulating layer 120 that are arranged in the lower surface of the first conductive layer 215c may be removed while the buffer layer 110 may not be removed. However, for convenience of description, a case where a part of the interlayer insulating layer 130, a part of the gate insulating layer 120, and a part of the buffer layer 110 that are arranged in the lower surface of the first conductive layer 215c are removed will be described in detail below.

In this regard, when the organic material layer is not present, structures, manufacturing methods, or characteristics explained in the above-described embodiments regarding the protection film 175 including the protection film base 170 and the viscous layer 180 may be applied.

The display apparatus may not include the planarization layer (not shown) and thus the first conductive layer 215c may be exposed to the outside in the bending area BA. In this case, the bending protection layer 600 may shield a part of the first conductive layer 215c.

The bending protection layer 600 may include the first bending protection layer 610 and the second bending protection layer 620 that are distinguished from each other. In this regard, the first bending protection layer 610 and the second bending protection layer 620 may be formed in the same or similar way as described in FIGS. 1 through 13.

Specifically, as shown in FIG. 23, the first bending protection layer 610 may be arranged outside the opening 170OP. In this case, the first bending protection layer 610 may be arranged outside the bending area BA. The first bending protection layer 610 may form a closed loop as described above. Thereafter, the second bending protection layer 620 may be formed inside the first bending protection layer 610 after curing the first bending protection layer 610. In this case, the first bending protection layer 610 may be cured to function as a dam so that the second bending protection layer 620 may not move outside the first bending protection layer 610. If the second bending protection layer 620 is completely coated, the second bending protection layer 620 may be cured. Thereafter, as shown in FIG. 24, a part of an edge of the substrate 100 may be removed. In this case, the substrate 100, various layers stacked in the substrate 100, a part of the protection film 175, and the first bending protection layer 610 may be removed. In particular, the first bending protection layer 610 arranged in side surfaces of the substrate 100 in a Y direction in FIG. 24 may be partially or wholly removed. In this case, in the side surfaces of the substrate 100 in a Y direction in FIG. 24, a part of the first bending protection layer 610 and the second bending protection layer 620 may be present in a stack state or only the second bending protection layer 620 may remain. The first bending protection layer 610 and the second bending protection layer 620 may be wholly present over the substrate 100 in an X direction in FIG. 24.

The bending protection layer 600 may be formed as shown in FIG. 22, but the embodiments are not limited thereto. In another embodiment, the display apparatus as described above may not include the organic material layer, may include the planarization layer, and may include the bending protection layer 600 over the planarization layer.

The bending protection layer 600 may be formed in contact with the OCA 510 and the polarizer 520.

In another example embodiment, at least a part of the bending protection layer 600 may overlap a part of the encapsulation layer 400. In this case, a part of the bending protection layer 600 may overlap at least one of the first inorganic encapsulation layer 410 and the second inorganic encapsulation layer 430. In this case, at least a part of the first bending protection layer 610 may be arranged over the encapsulation layer 400. The bending area BA or the opening 170OP may be arranged in a lower surface of the second bending protection layer 620 so that the bending protection layer 600 may completely cover the bending area BA. The second conductive layer 213a and a part of the first conductive layer 215c may be arranged in a lower surface of the bending protection layer 600. In this case, the first conductive layer 215c and the second conductive layer 213a may be blocked from external air by the bending protection layer 600. In this regard, the embodiments are not limited thereto. That is, as described above, in addition to the case where the bending protection layer 600 overlaps at least one of the first inorganic encapsulation layer 410 and the second inorganic encapsulation layer 430, the bending protection layer 600 may not overlap at least one of the first inorganic encapsulation layer 410 and the second inorganic encapsulation layer 430. According to an example embodiment, the bending protection layer 600 may not overlap at least one of the first inorganic encapsulation layer 410 and the second inorganic encapsulation layer 430 in the same or similar manner as shown in FIGS. 11, 13, 15 and 18-21. The bending protection layer 600 of FIGS. 11, 13, 15, and 18-21 may overlap at least one of the first inorganic encapsulation layer 410 and the second inorganic encapsulation layer 430 in the same or similar manner as the bending protection layer 600 of FIG. 22.

A display apparatus according to the embodiments may form a bending protection layer to have a determined height within a determined range. The display apparatus according to the embodiments may also sufficiently endure stress concentrated on an edge of the bending protection layer when the display apparatus is bent.

According to a method of manufacturing a display apparatus of the example embodiments, a bending protection layer may be formed to have a designed width at an exact location. Also, according to the method of manufacturing a display apparatus of the example embodiments, the bending protection layer may be simply and quickly formed.

It should be understood that the example embodiments described herein should be considered in a descriptive sense only and not for purposes of limitation. Descriptions of features or aspects within each embodiment should typically be considered as available for other similar features or aspects in other embodiments.

While one or more example embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
    forming a display unit in a first area of a substrate comprising a bending area located between the first area and a second area;
    attaching a protection film onto a lower surface of the substrate, wherein the protection film comprises a protection film base and a viscous layer, the protection film base not directly contacting the substrate;
    forming a first bending protection layer over the substrate corresponding to at least a part of a boundary of an opening or over the substrate of an outside of the boundary of the opening and curing the first bending protection layer; and
    forming a second bending protection layer over the substrate so that at least a part of the second bending protection layer corresponds to an inside of the boundary of the opening.

2. The method of claim 1, further comprising:
    attaching a carrier film onto the protection film.

3. The method of claim 1, further comprising:
    curing the second bending protection layer.

4. The method of claim 1, wherein at least a part of the second bending protection layer overlaps the first bending protection layer.

5. The method of claim 1, wherein a maximum height of the first bending protection layer is greater than a maximum height of the second bending protection layer.

6. The method of claim 1, wherein a point corresponding to a maximum height of the first bending protection layer is outside the boundary of the opening.

7. The method of claim 1, wherein the first bending protection layer is arranged over the substrate and overlaps the boundary of the opening.

8. The method of claim 1, wherein the first bending protection layer is formed in a closed loop.

9. The method of claim 1, wherein an area of the bending protection layer is greater than an area of the opening.

10. The method of claim 1, wherein an area of the opening is greater than an area of the bending area.

11. The method of claim 1, further comprising:
    bending the substrate with respect to a bending axis in the bending area.

12. The method of claim 11, further comprising:
    at least partially filling the opening with a filler after bending the substrate.

13. The method of claim 11, further comprising:
    arranging a cushion layer between the first area and the second area after the bending of the substrate.

14. The method of claim 1, further comprising:
    coating the opening with a liquefied or paste filler.

15. The method of claim 14, further comprising:
    curing the liquefied or paste filler.

* * * * *